United States Patent [19]
Abe et al.

[11] Patent Number: 5,889,299
[45] Date of Patent: Mar. 30, 1999

[54] THIN FILM CAPACITOR

[75] Inventors: Kazuhide Abe, Kawasaki; Shuichi Komatsu, Yokohama; Mitsuaki Izuha, Chiba; Noburu Fukushima, Tokyo; Kenya Sano, Kawasaki; Takashi Kawakubo, Yokohama, all of Japan

[73] Assignee: Kabushiki Kaisha Toshiba, Kawasaki, Japan

[21] Appl. No.: 804,394

[22] Filed: Feb. 21, 1997

[30] Foreign Application Priority Data

Feb. 22, 1996 [JP] Japan .................................... 8-034868
Jul. 25, 1996 [JP] Japan .................................... 8-196198

[51] Int. Cl.$^6$ .................................................. H01L 29/76
[52] U.S. Cl. .......................................... 257/295; 257/532
[58] Field of Search ...................... 257/295, 532

[56] References Cited

U.S. PATENT DOCUMENTS 5,691,219 11/1997 Kawakubo et al. ............. 148/DIG. 14
5,739,563 4/1998 Kawakubo et al. .................... 257/295
5,760,432 6/1998 Abe et al. ................................ 257/295

OTHER PUBLICATIONS

Song–Tae Lee, et al., "Epitaxial Growth of BaTiO$_3$ Thin Films and Thier Internal Stresses", Jpn. J. Appl. Phys., vol. 34, No. 9B, Sep. 1995, pp. 5168–5171.

Y. Yano, et al., "Epitaxial Growth and Dielectric Properties of BaTiO$_3$ Films on Pt Electrodes by Reactive Evaporation", J. Appl. Phys., vol. 76, No. 12, Dec. 15, 1994, pp. 7833–7838.

Kazuhide Abe, et al., "Ferroelectric Properties in Epitaxially Grown Ba$_x$Sr$_{1-x}$TiO$_3$ Thin Films", J. Appl. Phys., vol. 77, No. 12, Jun. 15, 1995, pp. 6461–6465.

Kazuhide Abe, et al., "Epitaxial Growth and Dielectric Properties of (Ba$_{0.24}$Sr$_{0.76}$)TiO$_3$ Thin Film", Jpn. J. Appl. Phys., vol. 33, No. 9b, Sep. 1994, pp. 5297–5300.

*Primary Examiner*—J. Carroll
*Attorney, Agent, or Firm*—Oblon, Spivak, McClelland, Maier & Neustadt, P.C.

[57] ABSTRACT

A thin film capacitor including a first electrode having on its surface a (100) face of cubic system or a (001) face of tetragonal system, a dielectric thin film epitaxially grown on the first electrode and exhibiting a crystal structure which inherently belongs to a perovskite structure of cubic system, and a second electrode formed on the dielectric thin film. Further, the dielectric thin film meets the following relationship $V/V_0 \geq 1.01$ where a unit lattice volume of true perovskite crystal structure belonging to the cubic system (lattice constant $a_0$) is represented by $V_0 = a_0^3$, and a unit lattice volume (lattice constant $a = b \neq c$) which is strained toward a tetragonal system after the epitaxial growth is represented by $V = a^2 c$, and also meets the following relationship $c/a \geq 1.01$ where $c/a$ represents a ratio between a lattice constant "c" in the direction thicknesswise of the film and a lattice constant "a" in the direction parallel with a plane of the film.

23 Claims, 14 Drawing Sheets

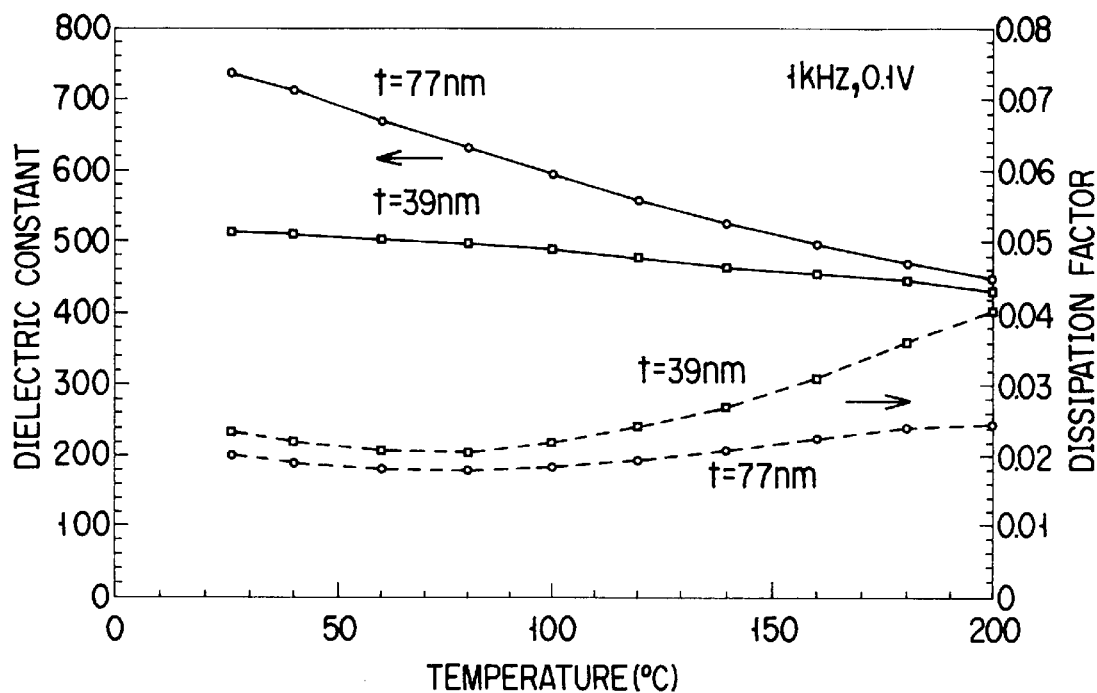
F I G. 8
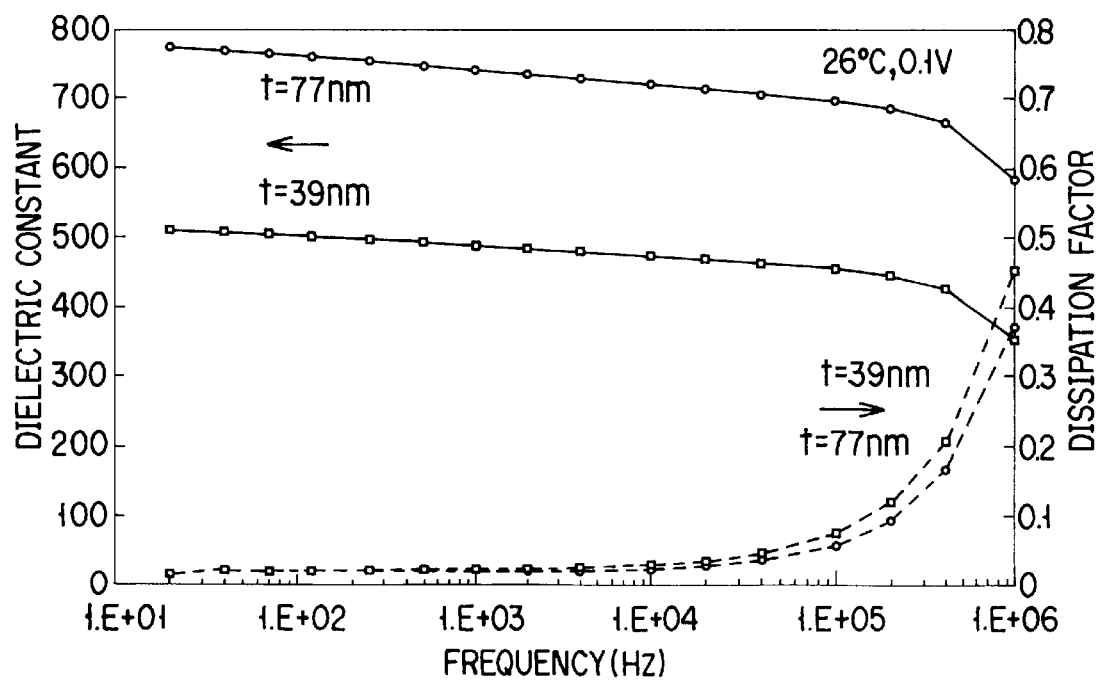
F I G. 9

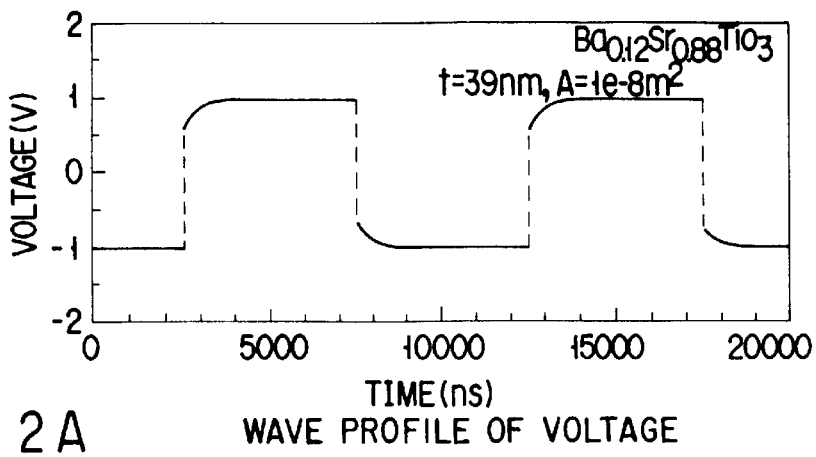
FIG. 12A  WAVE PROFILE OF VOLTAGE
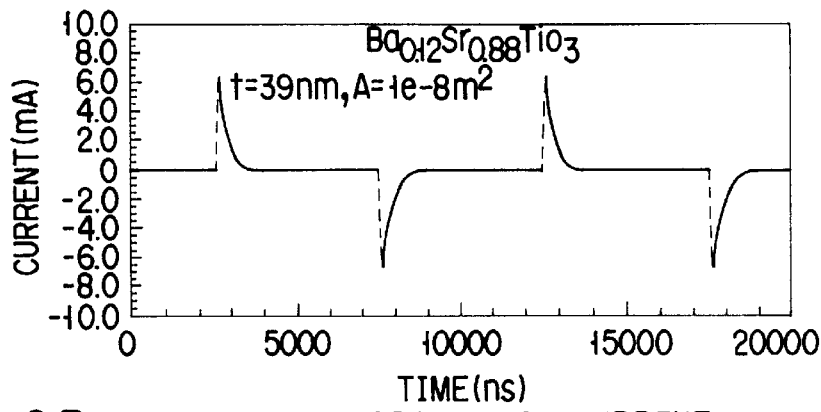
FIG. 12B  WAVE PROFILE OF CURRENT
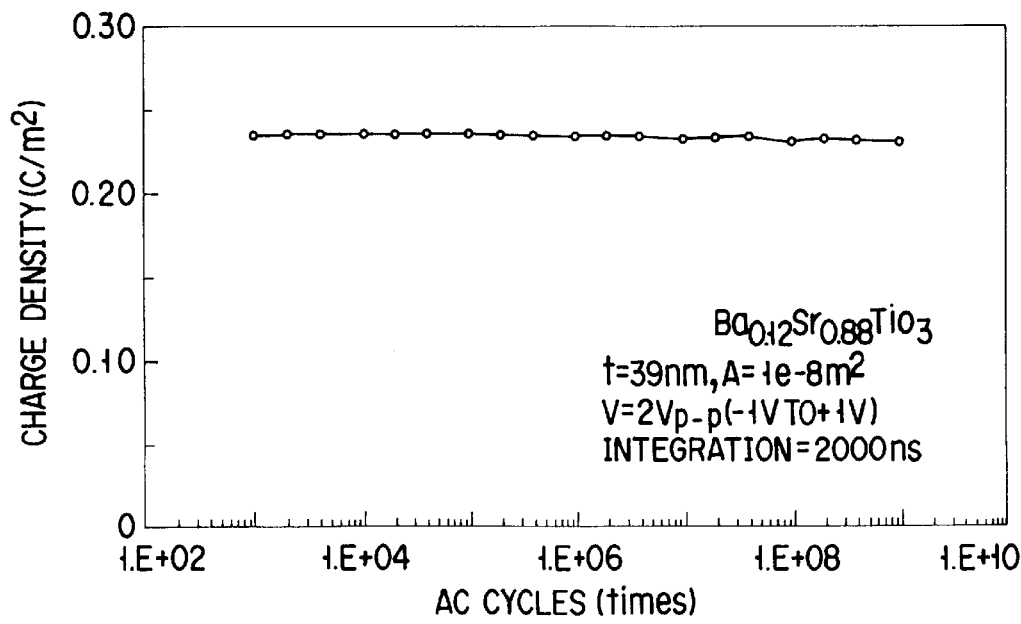
FIG. 13

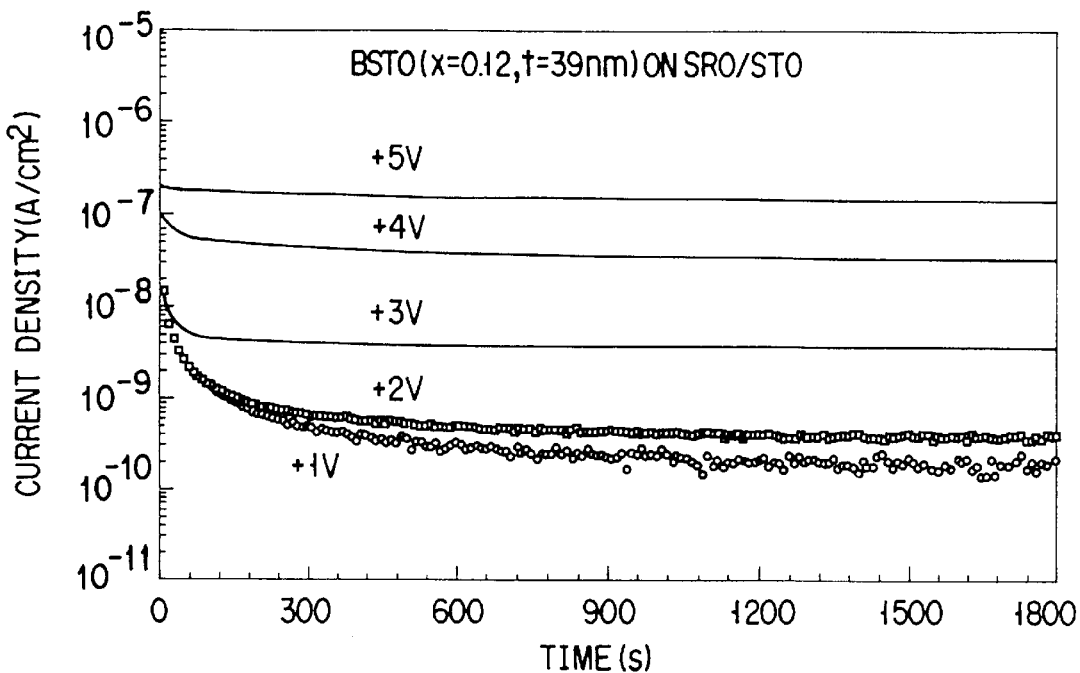
FIG. 16A  POSITIVE POLARITY
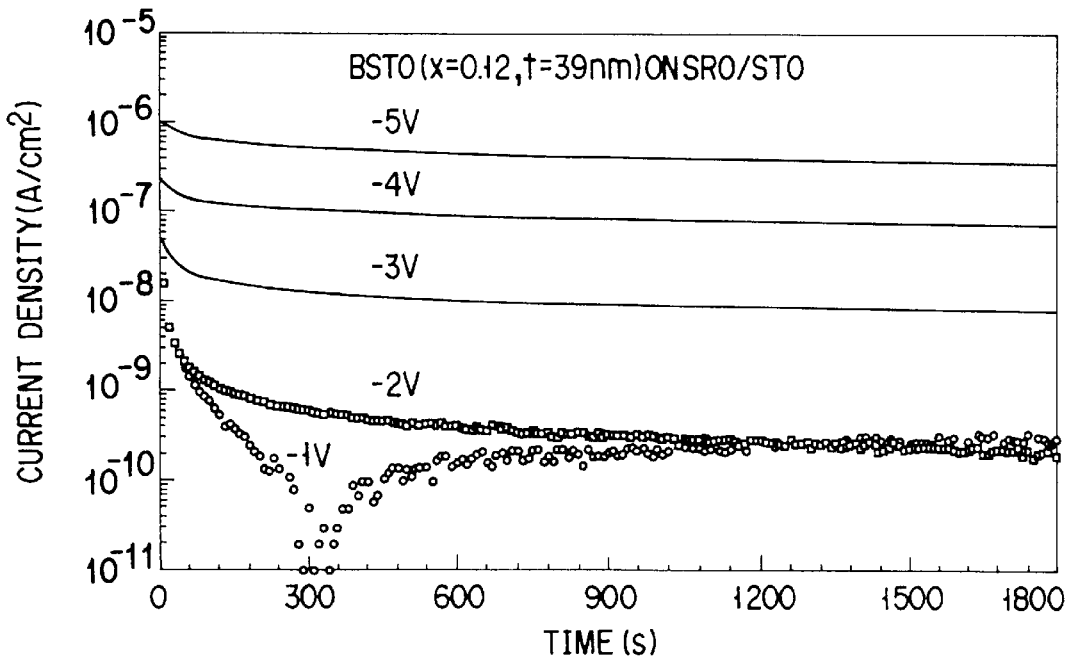
FIG. 16B  NEGATIVE POLARITY

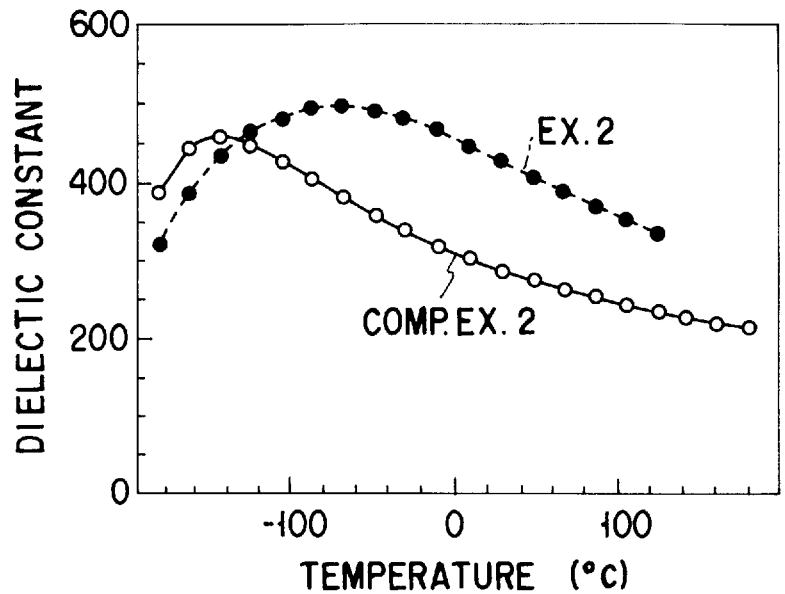
F I G. 23
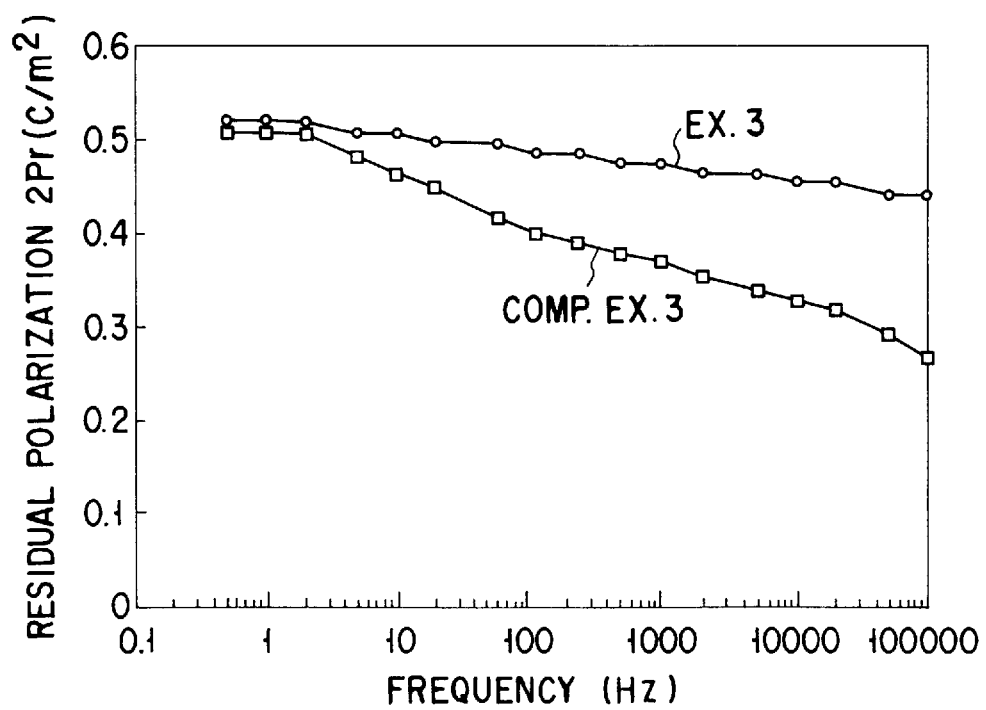
F I G. 24

THIN FILM CAPACITOR

BACKGROUND OF THE INVENTION

This invention relates to a thin film capacitor which is useful as a thin film capacitance element in a semiconductor integrated circuit or in the peripheral circuit of semiconductor integrated circuit.

There has been a rapid progress in the integration of LSI, in particular DRAM (Dynamic Random Access read write Memory) whose integration has been increased by four times as compared with that of three years before. This trend of increasing the integration is expected to be further advanced in future in the same rapidness as in seen in the past few years. However, since it is required in the case DRAM to retain a prescribed capacitance in view of assuring the sensitivity of a sense circuit as well as in view of preventing a soft error by a radiation, the effective area of a capacitor within a memory cell cannot be diminished in proportion to an increase in integration of semiconductor elements. As a result, as long as a silicon oxide film is employed as a dielectric material, it is inevitable that the area occupied by a capacitor in a memory cell becomes increasingly larger as the integration is further advanced.

On the other hand, there has been extensively studied to employ a thin film having a high dielectric constant as a dielectric film of capacitor in a memory cell of DRAM. The purpose of using the thin film having the high dielectric constant as a dielectric film of capacitor is to minimize the area of capacitor so as to miniaturize a high integrated memory cell. If a thin film having the high dielectric constant is to be employed as a dielectric film of capacitor in a memory cell of DRAM, the quantity of electric charge that can be stored per unit area is required to be large and at the same time a leakage current is required to be small. Furthermore, for the purpose of operating a memory at a high speed, it is desired that both charging and discharging can be performed at a sufficiently high speed.

Under the circumstances, the employment of $Ta_2O_5$ (relative dielectric constant: about 28) has been studied for the application thereof to a memory cell of DRAM in place of the conventional dielectric films, i.e. silicon oxide ($SiO_2$) film (relative dielectric constant: about 4) and silicon nitride ($Si_3N_4$) film (relative dielectric constant: about 7). However, the magnitude of the dielectric constant of $Ta_2O_5$ is still insufficient to meet the demand for increasing the integration by minimizing the area of capacitor.

Accordingly, the employment of strontium titanate ($SrTiO_3$) or of barium strontium titanate ($Ba_xSr_{1-x}TiO_3$) has been extensively studied as a candidate for a dielectric material having a higher dielectric constant. The (Ba, Sr) $TiO_3$ is formed of a solid solution comprising $BaTiO_3$ and $SrTiO_3$, forming a perovskite crystal structure. It is known that $SrTiO_3$ is a paraelectric material, and $BaTiO_3$ is a ferroelectric substance having a Curie temperature of about 120° C.

Since Sr and Ba are less evaporable as compared with Pb or Bi, the control in composition of (Ba, Sr) $TiO_3$ is relatively easy in the formation of a thin film of (Ba, Sr) $TiO_3$. Moreover, when these $BaTiO_3$ and $SrTiO_3$ are crystallized, there is a little possibility of these crystals take any other crystal structure (such as pyrochlore structure) than the perovskite crystal structure.

There is a problem however in ($Ba_xSr_{1-x}TiO_3$) that when this compound is formed into a thin film of not more than 100 nm in thickness, the dielectric constant thereof is lowered, thus making it impossible to store a sufficient electric charge therein.

Meanwhile, a memory device employing a ferroelectric substance as a capacitor (ferroelectric memory) is now being developed as a memory medium. As a matter fact, some ferroelectric memories have been actually put into practical use. Since the ferroelectric memory is non-volatile, the memory once stored in the memory would not be dissipated even after a power source is turned off. Moreover, the ferroelectric memory is featured in that the inversion of spontaneous polarization is very fast if the film thickness thereof is sufficiently thin, so that a high speed writing and reading which is comparable to that of DRAM is possible. Furthermore, since the ferroelectric memory cell of one bit can be constructed with a single transistor and a single ferroelectric capacitor, it is suited for manufacturing a large storage device.

It is also studied to operate a ferroelectric memory in a manner of DRAM. Namely, in this case, the ferroelectric substance is employed as a memory cell capacitor of the DRAM without allowing the spontaneous polarization of the ferroelectric substance to be inverted in the ordinary operation. However, the ferroelectric memory is used, by taking advantage of a residual polarization of the ferroelectric thin film, as a non-volatile memory only at a moment prior to the turn-off of the power of apparatus. This method is effective in minimizing the effect of a phenomenon (fatigue) that the ferroelectricity of the ferroelectric memory is gradually deteriorated with a repetition of the polarization inversion, which has been considered to be most the serious problem of the ferroelectric memory.

It is required for a ferroelectric thin film suited for use in a ferroelectric memory to have various features, such as being large in residual polarization, low in temperature dependence of residual polarization, minimal in deterioration (fatigue) of residual polarization resulting from the repetition of polarization inversion, and capable of maintaining the residual polarization for a long period of time (retention). Additionally, for the purpose of actuating the memory at a high speed, the inversion of spontaneous polarization is required to be sufficiently rapid.

At present, lead zirconate titanate (PZT) has been mainly employed as a ferroelectric material. This PZT is formed of a solid solution comprising lead zirconate ($PbZrO_3$) and lead titanate ($PbTiO_3$). In particular, a PZT which is formed of a solid solution comprising lead zirconate and lead titanate at a ratio of approximately 1:1 in molar ratio is considered to be large in spontaneous polarization and capable of inverting even at a low electric field, and hence considered to be excellent as a memory medium. Since the transition temperature (Curie point) between ferroelectric phase and paraelectric phase is relatively high, i.e. about 300° C., there is little probability that a data stored in the memory is vanished by heat as long as the memory is kept within a range of temperature (not more than 120° C.) which the ordinary electronic circuit would encounter.

However, the manufacture of a thin film of the PZT which is excellent in quality is known to be difficult. First of all, since lead (Pb) constituting a main component of the PZT easily evaporates at a temperature of 500° C. or higher, an accurate control of the composition of PZT is very difficult. Secondly, although it is known that the PZT exhibits a ferroelectricity only when the PZT takes a perovskite crystal structure, it is very difficult to obtain a PZT film having a perovskite crystal structure. Instead, it is easy to obtain a PZT having a pyrochlore structure, which however does not exhibit ferroelectricity. In order to obtain a PZT film of perovskite crystal structure, a treatment at more or less high temperature (about 500° C.) is required. However, if the PZT film is treated at such a high temperature, Pb is caused to evaporate or diffuse as mentioned above, thereby making it difficult obtain a PZT film of desired composition.

Recently, research on $SrBi_2Ta_2O_9$, which is one of Bi series layer perovskite compounds, is being extensively performed in an effort to apply it to a ferroelectric memory, etc. However, although Bi is an element having a low melting point just like Pb, it is required to be sufficiently crystallized for attaining a hysteresis, i.e. it is required to be heat-treated at a high temperature (700° C.). The heating of the compound at such a high temperature cannot be carried out without inviting various problems that Bi would be evaporated or diffused into electrodes or other portions of device. Additionally, in spite of the fact that this compound is highly anisotropic in crystallinity, when this compound is desired to be used in the form of a non-orientated polycrystalline film, the problem of non-uniformity in ferroelectricity among the finely processed films would be raised.

In spite of such a difficulty as mentioned above in the manufacture of a PZT thin film or Bi series layer compound thin film of high quality with good reproducibility, these thin films are still extensively studied as a candidate for a memory medium (capacitor), because there is no other ferroelectric material other than PZT and Bi-based compounds which is suited for use as a memory capacitor.

Except for PZT, barium titanate ($BaTiO_3$) is known to exhibit ferroelectricity at room temperature. This $BaTiO_3$ is known as having the same perovskite crystal structure as that of PZT and a Curie point of about 120° C. Since Ba is less evaporable as compared with Pb, the control of composition in the manufacture of a thin film of $BaTiO_3$ is relatively easy. Moreover, once this $BaTiO_3$ is crystallized, there is little possibility that this $BaTiO_3$ takes any other crystal structure (a pyrochlore structure) than the perovskite crystal structure.

In spite of these advantages, the $BaTiO_3$ for use as a thin film capacitor has not been seriously taken up for study as a candidate for a memory medium of ferroelectric memory. One of the reasons for this can be ascribed to the facts that the residual polarization thereof is small as compared with PZT and the temperature dependence of the residual polarization is relatively large. In other words, the reason may be ascribed to the facts that the Curie temperature Tc of the $BaTiO_3$ is inherently relatively low (about 120° C.), and the coercive electric field of the $BaTiO_3$ is relatively low. In this case, the Curie temperature Tc means a temperature at the moment of phase transition from the ferroelectric phase to the paraelectric phase, which is inherent to a ferroelectric material so that a material, even exhibiting ferroelectricity at room temperature, would not exhibit ferroelectricity at a temperature higher than the Curie temperature. Therefore, when a ferroelectric memory is manufactured by making use of a thin film capacitor consisting of $BaTiO_3$, not only there is a probability that the data stored therein may be vanished when the memory is once exposed to a high temperature (120° C.) for some reason, but also the temperature dependence of residual polarization is relatively large even at a temperature range (85° C. or less) to which an electronic circuit is generally exposed, thus making the operation of the memory unstable.

Therefore, it has been considered that a thin film capacitor formed of a ferroelectric thin film consisting of $BaTiO_3$ is not suited for use as a memory medium of a ferroelectric memory.

Meanwhile, it has been recently reported a phenomenon that when a $BaTiO_3$ film was epitaxially grown to a thickness of 60 nm on a Pt/MgO single crystal substrate, the Curie temperature thereof was raised up to 200° C. or more (K. Iijima, Appl. Phys., Vol.62, No.12 (1993), pp.1250–1251). This document reports that this phenomenon is assumed to have been brought about by a shrinkage of a-axis and an extension of c-axis of $BaTiO_3$ perovskite lattice, since the $BaTiO_3$ film has been epitaxially grown in conformity with the lattice constant of Pt. This document further goes on saying that this phenomenon can be observed only when the thickness of the $BaTiO_3$ film is not more than 60 nm, and that if the thickness of the $BaTiO_3$ film exceeds over 60 nm, the lattice constant of the $BaTiO_3$ film would be relaxed to that inherent to the $BaTiO_3$ due to a misfit dislocation (due to an increase of film thickness to larger than the critical film thickness).

On the other hand, it is known that if a thickness of a ferroelectric thin film is not more than 1 $\mu$m, the residual polarization becomes smaller with a decrease in film thickness of the ferroelectric thin film. As a matter of fact, the aforementioned document reported that when the film thickness of the $BaTiO_3$ epitaxial film was 100 nm or less, the residual polarization thereof was limited to not more than 2 to 3 $\mu C/cm^2$. Therefore, even if it is possible with the employment of a $BaTiO_3$ epitaxial film having a thickness of 60 nm or less to raise the Curie temperature, it is impossible to attain a sufficient residual polarization for practical use as a ferroelectric thin film.

Because of these reasons, it has been considered that even if it is possible with the employment of the conventional $BaTiO_3$ thin film capacitor to raise the Curie temperature by way of epitaxial effect, it is very difficult to actually use it as a memory medium for use in a ferroelectric memory.

With a view to solve the aforementioned problems involved in the conventional ferroelectric thin film, the present inventors have discovered that, if a dielectric material (for example, $Ba_xSr_{1-x}TiO_3$) having a lattice constant which is relatively close to that of a lower electrode (for example, Pt) is employed and at the same time if an RF magnetron sputtering method which is comparatively effective in avoiding misfit dislocation during the deposition of film is adopted as a method of forming a film, it is possible, even if the thickness of the film is as thick as about 200 nm, to maintain a state of film where the lattice constant is extended in the direction of film thickness (c-axis) while the lattice constant in-plane of film (a-axis) is shrunk as compared with those of the inherent lattice constant which can be obtained through an epitaxial effect. As a result, it has been confirmed that it is possible to shift the ferroelectric Curie temperature Tc toward a higher temperature side and hence to obtain a ferroelectric thin film which is capable of exhibiting a large residual polarization at room temperature and maintaining a sufficiently large residual polarization even if the temperature of the film is raised up to about 85° C.

For example, it has been experimentally confirmed by the employment of Pt (lattice constant a=0.39231 nm) which is hardly oxidized as a lower electrode and strontium barium titanate ($Ba_xSr_{1-x}TiO_3$: as BST; x=0.44 to 0.90) as a dielectric substance that this dielectric substance is capable of exhibiting ferroelectricity even if the composition thereof is shifted to a compositional region (x≦0.7) where ferroelectricity is not expected to be exhibited inherently at room temperature, and that when this dielectric substance is in the compositional region where ferroelectricity can be inherently exhibited at room temperature, the Curie temperature thereof can be further raised beyond the inherent Curie point (which is higher than room temperature), indicating that preferable ferroelectric properties for practical use can be realized.

The present inventors have further found out that a method of introducing a strain to a ferroelectric substance by taking advantage of mismatching in lattice constant between a lower electrode and the ferroelectric substance is also effective for improving a dielectric constant of paraelectric thin film. Namely, it has been found out that when a thin film of $Ba_xSr_{1-x}TiO_3$ (where x (the content of Ba)=about 0.24) is epitaxially grown on a Pt layer, a phenomenon of a prominent increase in dielectric constant can be observed even though no ferroelectricity can be observed. Therefore, it is possible by taking advantage of this phenomenon to greatly increase the accumulation of electric charge in a dielectric film to be employed for a memory cell of DRAM.

However, it has been found by the latest experiments made by the present inventors that when an epitaxial film of $Ba_xSr_{1-x}TiO_3$ as a dielectric substance is deposited on a lower electrode so as to obtain the aforementioned epitaxial effects by taking advantage of mismatching of lattice constant, i.e. to provide a paraelectric material with ferroelectricity; to provide a ferroelectric material with an enhanced ferroelectricity; or to provide a paraelectric material with an increased dielectric constant, various problems would be raised in the operation of device at a high speed.

Namely, it has been found that when a film is formed of a ferroelectric substance, the D-E hysteresis depicted with a higher frequency may indicate a lower residual polarization as compared with that where the D-E hysteresis is depicted with a lower frequency. Further, when a film is formed of a paraelectric substance, the frequency dependence of a dielectric constant becomes larger, so that a phenomenon that dielectric constant is lowered with an increase in frequency may be seen.

BRIEF SUMMARY OF THE INVENTION

Accordingly, an object of the present invention is to provide a thin film capacitor which is capable of accumulating a large quantity of electric charge with a small area.

Another object of this invention is to provide a thin film capacitor which is suited for increasing the capacity and integration of semiconductor memory.

Namely, according to the present invention, there is provided a thin film capacitor comprising a first electrode having on its surface either one of a (100) face of cubic system and a (001) face of tetragonal system; a dielectric thin film epitaxially grown on the first electrode and exhibiting a crystal structure which inherently belongs to a perovskite structure of cubic system; and a second electrode formed on the dielectric thin film;

wherein the dielectric thin film meets the following relationship:

$$V/V_0 \geq 1.01$$

where a unit lattice volume of true perovskite crystal structure belonging to the cubic system (lattice constant: $a_0$) is represented by $V_0=a_0^3$, and a unit lattice volume (lattice constant $a=b \neq c$) which is strained toward a tetragonal system after the epitaxial growth is represented by $V=a^2c$; and also meets the following relationship:

$$c/a \geq 1.01$$

where c/a represents a ratio between a lattice constant "c" in the direction thicknesswise of the film and a lattice constant "a" in the direction parallel with a plane of the film.

According to the present invention, there is further provided a thin film capacitor comprising a first electrode having on its surface either one of a (100) face of cubic system and a (001) face of tetragonal system; a dielectric thin film epitaxially grown on the first electrode and exhibiting a crystal structure which inherently belongs to a perovskite structure of cubic system; and a second electrode formed on the dielectric thin film;

wherein the dielectric thin film meets the following relationship:

$$a_0/a_s \geq 1.002$$

where $a_s$ represents a lattice constant in the direction parallel with a surface of the first electrode, and $a_0$ represents a lattice constant inherent to a dielectric material constituting the dielectric thin film, which can be expressed by a length of a-axis of the perovskite crystal structure belonging to the cubic system; and also meets the following relationship:

$$c/a \geq 1.01$$

where c/a represents a ratio between a lattice constant "c" in the direction thicknesswise of the film and a lattice constant "a" in the direction parallel with a plane of the film.

According to the present invention, there is further provided a thin film capacitor comprising a first electrode having on its surface either one of a (100) face of cubic system and a (001) face of tetragonal system; a dielectric thin film epitaxially grown on the first electrode and exhibiting a crystal structure which inherently belongs to a perovskite structure of cubic system, the dielectric thin film being formed of a dielectric material having a Curie temperature of not more than 200° C.; and a second electrode formed on the dielectric thin film;

wherein the dielectric thin film meets the following relationship:

$$1.002 \geq a_0/a_s \geq 1.015$$

where $a_s$ represents a lattice constant in the direction parallel with a surface of the first electrode, and $a_0$ represents a lattice constant inherent to the dielectric material, which can be expressed by a length of a-axis of the perovskite crystal structure belonging to the cubic system or to the tetragonal system; and also meets the following relationship:

$$a/a_s \geq 1.002$$

where "a" represents a lattice constant in the direction parallel with a plane of the dielectric thin film obtained through the epitaxial growth of the dielectric material.

According to the present invention, there is further provided a method of manufacturing a dielectric thin film of perovskite crystal structure, which comprises the steps of: epitaxially growing a perovskite dielectric material on a conductive substrate having on its surface either one of a (100) face of cubic system and a (001) face of tetragonal system in an atmosphere containing oxygen at a ratio of 70% or more, thereby forming a dielectric thin film having a perovskite crystal structure wherein a ratio between a lattice constant "c" in the direction thicknesswise of the film and a lattice constant "a" in the direction parallel with a plane of the film (c/a) is 1.01 or more.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 8 is a graph showing a temperature dependence of dielectric constant and dielectric loss of $Ba_{0.12}Sr_{0.88}TiO_3$ films (film thickness: 39 nm and 77 nm);

FIG. 9 is a graph showing a frequency dependence of dielectric constant of $Ba_{0.12}Sr_{0.88}TiO_3$ films (film thickness: 39 nm and 77 nm);

FIGS. 12A and 12B are graphs illustrating the wave profile of voltage and the wave profile of current which have been employed in an ac voltage load test;

FIG. 13 is a graph illustrating the changes of accumulated charge with the number of repetition cycles of ac voltage applied;

FIGS. 16A and 16B are graphs illustrating changes with time of leakage current when a positive voltage (a) as well as a negative voltage (b) of dc current are applied to a $Ba_{0.12}Sr_{0.88}TiO_3$ film (film thickness: 39 nm);

FIG. 23 is a graph showing a temperature dependence of relative dielectric constant in the thin film capacitors of Example 2 and Comparative Example 2;

FIG. 24 is a graph showing a frequency dependence of residual polarization in the $BaTiO_3$ films of Example 3 and Comparative Example 3;

DETAILED DESCRIPTION OF THE INVENTION

Figure 1:
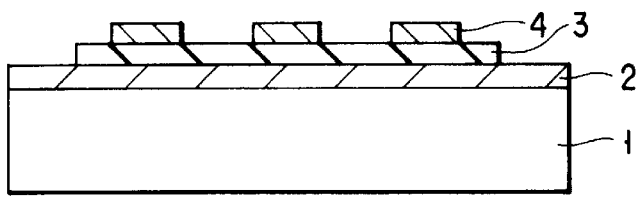
FIG. 1 is a cross-sectional view of a thin film capacitor according to one example of this invention.

The thin film capacitor according to this invention is based on the following principle.

Namely, by allowing a dielectric film to be epitaxially grown on the surface of a lower electrode, it is possible to enhance the dielectric constant of the film while keeping the paraelectricity thereof as it is, to provide the film, which is originally formed of paraelectric material, with a ferroelectricity or to enhance the ferroelectricity of the film which is formed of ferroelectric material. The reason for the development of these effects (or epitaxial effects) can be ascribed to the facts that since the dielectric material is caused to epitaxially grow in conformity with the lattice constant of the lower electrode, the lattice constant of the dielectric film in the in-plane direction is caused to shrink, while the lattice constant in the thicknesswise direction of the film is caused to extend on the contrary.

Generally, a dielectric or ferroelectric material of perovskite type crystal structure can be represented by a chemical formula "$ABO_3$", and a large polarization thereof is considered to be derived from a relative displacement of positive ions and negative ions. In particular, it is considered that the displacement of negative ions governs the polarization characteristics. When a two-dimensional compression stress is applied onto a dielectric substance having such a perovskite structure, the lattice is caused to extend in the direction perpendicular to the stress, thereby facilitating the displacement of ions, particularly B site ions, thus easily resulting in the polarization of the dielectric substance. As a result, the dielectric constant of the dielectric substance can be increased when it is formed of paraelectric material. Furthermore, according to circumstances, the dipole-dipole interaction in the thicknesswise direction may become enlarged thereby to induce a ferroelectricity. In this case, when the dielectric substance is formed of a ferroelectric material, the magnitude of spontaneous polarization thereof would be enlarged.

These effects can be seen most conspicuously in the case when a dielectric substance having a larger lattice constant than that of the lower electrode is epitaxially grown. However, these effects can be seen also in the cases where the lattice constant of dielectric substance is equal to or smaller than that of the lower electrode. In particular, these effects can be seen more prominently when the unit lattice volume "V" of a dielectric film is made larger than the true unit lattice volume "$V_0$" of the dielectric substance by 1% or more by making use of a sputtering method.

However, when a dielectric substance inherently having a larger lattice constant than that of the lower electrode is epitaxially grown, a dielectric film having the same crystal orientation as that of the lower electrode may be obtained, but the lattice constant in the in-plane direction of the dielectric film to be grown may not necessarily be completely identical to that of the lower electrode. Namely, some relaxation in the lattice mismatching may be generated at or near the interface thereof with the electrode, thereby inducing the dielectric film to take the original lattice constant which is inherent to the dielectric substance. This relaxation involving the lattice constant is considered to be brought about mainly due to the development of misfit dislocation in the dielectric film being grown. The degree of this relaxation is of course dependent largely on the method and conditions for forming a film, and the crystallinity, surface roughness and surface condition of the lower electrode.

However, the degree of this relaxation has much to do with the characteristics of ferroelectric film or dielectric film to be obtained. Namely, as illustrated in detail in the following examples, if the relaxation in lattice constant of the dielectric film becomes prominent, it becomes impossible for the dielectric film to retain the ferroelectric or dielectric property thereof to keep up with an increase in frequency. On the other hand, when the relaxation of strain in the dielectric film is small, it is possible for the dielectric film to retain the dielectric property thereof to keep up with an increase in frequency.

Namely, when the ratio of a lattice constant "a" in the in-plane direction of the dielectric film after an epitaxial growth thereof to a lattice constant "$a_s$" in the in-plane direction of the lower electrode as measured from an X-ray diffraction meets the condition of: $a/a_s < 1.002$, the relaxation of strain in the dielectric film is small, so that the dielectric property of the dielectric film can be retained to keep up with an increase of frequency up to sufficiently a high degree (1 MHz). On the other hand, if the ratio of $a/a_s$ is 1.002 or more, the variance of dielectric or ferroelectric property by the influence of frequency would be increased, so that it is impossible to obtain a sufficiently excellent dielectric property at a high frequency.

Based on the aforementioned principle, according to a first aspect of this invention, there is provided a thin film capacitor comprising a dielectric thin film which meets the following relationship:

$$V/V_0 \geq 1.01$$

where a unit lattice volume of true perovskite crystal structure belonging to the cubic system (lattice constant: $a_0$) is represented by $V_0 = a_0^3$, and a unit lattice volume (lattice constant $a=b \neq c$) which is strained toward a tetragonal system after the epitaxial growth is represented by $V=a^2c$; and also meets the following relationship:

$$c/a \geq 1.01$$

where c/a represents a ratio between a lattice constant "c" in the direction thicknesswise of said film and a lattice constant "a" in the direction parallel with a plane of said film.

As for the upper limit of $V/V_0$, although there is any particular limitation as far as the crystal is not fractured, the upper limit is generally 1.05.

Preferable the upper limit of c/a is 1.03 if the dielectric thin film is paraelectric substance and 1.08 if the dielectric thin film is ferroelectric substance.

According to a second aspect of this invention, there is provided a thin film capacitor comprising a thin film of perovskite type dielectric substance which not only meets the following relationship as the perovskite type dielectric substance belonging to the cubic system is epitaxially grown on the surface of an electrode:

$$a_0/a_s \leq 1.002$$

(where $a_0$ represents a lattice constant inherent to a dielectric bulk material constituting the dielectric thin film and as represents a lattice constant of the surface of the electrode, i.e. $a_0$ is substantially equal to or smaller than $a_s$), but also meets the following relationship:

$$c/a \geq 1.01$$

where c/a represents a ratio between a lattice constant "c" in the direction thicknesswise of the dielectric thin film and a lattice constant "a" in the direction parallel with the plane of the dielectric thin film.

Specific example of such a combination of the electrode material and the perovskite type dielectric substance is a combination of Pt and $SrTiO_3$. By the way, the lattice constant as of a Pt bulk of cubic system is 0.3923, while the lattice constant of $SrTiO_3$ bulk of cubic system is 0.3905.

When a perovskite type dielectric substance is epitaxially grown on the surface of an electrode of cubic system, a result can be a thin film of nearly monocrystalline structure. It is known that the perovskite type dielectric substance generally exhibits a larger dielectric constant as the crystal structure thereof becomes closer to the monocrystalline structure free from grain boundary. Additionally, since the grain boundary can be minimized when the crystal structure of a thin film is much closer to the monocrystalline structure, the leakage current can also be suppressed as compared with a polycrystalline film.

The limitation of the perovskite dielectric thin film according to this invention that the ratio (c/a) between a lattice constant "c" in the direction thicknesswise (or in the direction of [001]) of the dielectric thin film and a lattice constant "a" in the direction parallel with the plane (or in the direction of [100]) of the dielectric thin film should be 1.01 or more indicates in turn that the lattice constant is extended in the direction thicknesswise of the film, while the lattice constant is shrunk in the direction parallel with the surface of the film, so that the crystal structure of cubic system is collapsed and replaced by the crystal structure of a tetragonal system in the film.

Accordingly, the present inventors have found out that it is possible to induce a large dielectric constant with the employment of a perovskite dielectric thin film whose crystal structure is distorted such a way as to have a crystal structure which is very close to the tetragonal system. The reasoning for the generation of a large dielectric constant as a result of the distortion of crystal lattice may be explained such that in the case of $SrTiO_3$, the dislocation of Ti atoms in the crystal lattice is facilitated as a result of the distortion of crystal lattice, thereby making the polarization easy to take place.

Preferably, the ratio (c/a) between a lattice constant "c" in the direction thicknesswise of the perovskite dielectric thin film and a lattice constant "a" in the direction parallel with the plane of the perovskite dielectric thin film should be not more than 1.1. This is because, if the ratio of c/a exceeds over 1.1, it may be impossible to retain a desired crystal structure of the film.

On the other hand, if the ferroelectricity is desired to be induced by taking advantage of a mismatching of lattice, the ratio $a_0/a_s$ should preferably be controlled to 1.002 or more as mentioned above (a third aspect of the invention). If the ratio $a_0/a_s$ is lower than this lower limit, the increase of Curie temperature through the epitaxial effect can be hardly admitted, or, if admitted, the magnitude of the increase may be so small that it is hardly possible to obtain a ferroelectric substance having a sufficiently large spontaneous polarization. On the other hand, the reason for limiting the ratio $a_0/a_s$ to 1.015 or less is that if this ratio exceeds over this upper limit, misfit dislocations may be introduced into the dielectric film in the process of epitaxially growing the dielectric film on the surface of substrate, so that it is impossible, in the case of a thick dielectric film having a thickness exceeding over 60 nm, to expect a sufficient increase of Curie temperature.

Preferably, the ratio $a_0/a_s$ should be 1.004 or more in view of obtaining a prominent ferroelectricity. On the other hand, if the ratio $a_0/a_s$ is limited to not more than 1.011, the misfit of lattice constant can be minimized, thereby making it possible to obtain, irrespective of the temperature for forming the film, an epitaxially grown dielectric film having an excellent crystallinity with a relatively uniform lattice constant.

When the ratio $a_0/a_s$ is controlled to 1.002 or more according to this invention as mentioned above, the lattice constant "a" in the in-plane direction of the dielectric film after epitaxial growth should be controlled to $a/a_s<1.002$. This is because, if the lattice constant in the in-plane direction of the dielectric film after epitaxial growth is made identical with the lattice constant in the in-plane direction of the substrate, the strain inside the dielectric film that has been introduced through the aforementioned epitaxial effect becomes constant, resulting in a uniform ferroelectric or dielectric property in the thicknesswise direction, thus making it possible to obtain an excellent frequency characteristics of the ferroelectric or dielectric property and to achieve an operation of high speed.

In order to produce a dielectric film having a lattice constant (a-axis) which is identical in magnitude with the lattice constant (a-axis) of a lower electrode as mentioned above, the surface of the lower electrode is required to be treated prior to the formation of the dielectric film, or to optimize the initial conditions for forming the dielectric film. For example, it is possible to form a dielectric film having a lattice constant which is minimal in inconsistency with that of the lower electrode by blowing a plasma-activated oxygen gas onto the surface of the lower electrode prior to the deposition of the dielectric film. Furthermore, it is advantageous, in view of obtaining a dielectric film having a lattice constant which is consistent with that of the lower electrode, to form the dielectric film at a slow speed of not more than 1 nm/min in the initial stage of the film deposition, i.e. in the formation of the initial layer corresponding to several atoms.

If a ferroelectricity of a dielectric material is to be induced through a distortion of crystal according to this invention, the Curie temperature inherent to the dielectric material should preferably be 200° C. or less. The reason is that since a material having a Curie temperature exceeding over 200° C. generally contains lead or bismuth as a main component, it is difficult to suppress a fluctuation in composition of the dielectric material due to the evaporation of lead or bismuth at the occasion of forming a thin film thereof, thus making it difficult to obtain a dielectric film of excellent quality. Moreover, since lead and bismuth in a dielectric film tend to diffuse into other elements such as electrodes or insulating films as these elements are integrated, the composition of the dielectric film may become difficult to control. Further, as far as dielectric materials having a Curie temperature exceeding over 200° C. are concerned, since the Curie temperature of the dielectric materials is already sufficiently high, they can be used as they are without any trouble, so that the effects to be obtained by this invention may not be applicable to these dielectric materials.

Followings are specific examples of perovskite dielectric material and electrode which are useful for the thin film capacitor of this invention explained above.

As for the specific examples of dielectric material having a perovskite type crystal structure, compounds represented by the general formula, $ABO_3$ may be used.

In this formula, A represents at least one element selected from the group consisting of Ba, Sr and Ca; and B represents at least one element or composite selected from the group consisting of Ti, Zr, Hf, Sn, $Mg_{1/3}Nb_{2/3}$, $Mg_{1/3}Ta_{2/3}$, $Zn_{1/3}Nb_{2/3}$, $Zn_{1/3}Ta_{2/3}$, $Ni_{1/3}Nb_{2/3}$, $Ni_{1/3}Ta_{2/3}$, $Co_{1/3}Nb_{2/3}$, $Co_{1/3}Ta_{2/3}$, $Sc_{1/3}Nb_{2/3}$ and $Sc_{1/3}Ta_{2/3}$.

Among these compounds, compounds represented by $(Ba_xSr_{1-x})TiO_3$ ($0<x<0.7$, more preferably $0.05<x<0.24$) or by $(Ba_xSr_{1-x-y}Ca_y)TiO_3$ ($0<x<0.7$, more preferably $0.05<x<0.24$; $0.01<y<0.12$) are particularly preferable.

Specific examples of these compounds are a simple perovskite type oxide such as barium titanate ($BaTiO_3$), strontium titanate ($SrTiO_3$), calcium titanate ($CaTiO_3$), barium stannate ($BaSnO_3$) and barium zirconate ($BaZrO_3$); a composite perovskite type oxide such as barium magnesate tantalate ($Ba(Mg_{1/3}Ta_{2/3})O_3$) and barium magnesium niobate ($Ba(Mg_{1/3}Nb_{2/3})O_3$); and a solid solution comprising a plurality of these oxides.

The aforementioned dielectric material having a perovskite type crystal structure and represented by the general formula, $ABO_3$ may be modified such that Ba constituting "A" in the formula may be partially replaced by at least one element selected from Sr and Ca. Likewise, Ti constituting "B" in the formula may be partially replaced by at least one element or composite selected from Zr, Hf, Sn, $(Mg_{1/3}Nb_{2/3})$, $(Mg_{1/3}Ta_{2/3})$, $(Zn_{1/3}Nb_{2/3})$ and $(Zn_{1/3}Ta_{2/3})$. The reason for selecting these composition as a preferable example is that since the melting point of any of the oxides of these constituent elements (BaO, SrO, CaO, etc.) is as sufficiently high as 1,000° C. or more, these constituent elements can be hardly evaporated thereby maintaining the original composition even if the deposition of film is carried out at a temperature of about 600° C. for instance.

Therefore, it is not preferable to substitute the element of the A site by an element of low melting point such as Pb, but if the A site is required to be substituted by an element of low melting point, the substitution should preferably be limited to not more than 20%. The Curie temperature of the perovskite type oxide constituted by a combination of these elements is at most 120° C. as seen in the case of $BaTiO_3$ which exhibits the highest Curie temperature among these perovskite type oxides if the A site is not substituted by Pb at all. Therefore, these perovskite type oxides are not suited for practical use as a ferroelectric thin film if the Curie temperature thereof is kept remained as it is, i.e. the Curie temperature inherent to these perovskite type oxides.

A first electrode (lower electrode) to be employed in this invention is formed of a material of cubic system or tetragonal system, and preferably selected from conductive compounds of perovskite type crystal structure represented by the general formula: $ABO_3$ (wherein A represents at least one element selected from the group consisting of Ba, Sr, Ca and La; and B represents at least one element selected from the group consisting of Ru, Ir, Mo, W, Co, Ni and Cr).

Among these materials, $SrRuO_3$ is most preferable. The ratio between Sr and Ru; (Sr/Ru) in this case should preferably meet the condition of $0.9 \leq Sr/Ru \leq 1.1$. As for the crystallinity of $SrRuO_3$, full width of half minimum value of rocking curve thereof should preferably be 0.2° or less.

In addition to the aforementioned conductive compounds, Pt, Ir, Rh and Au can be used as an electrode material. In particular, Pt is expected to exhibit almost the same effect as that of $SrRuO_3$.

With regard to the value of lattice constant "$a_s$" of the lower electrode, a material having a lattice constant "$a_s$" of 0.3935 nm or more may be preferably employed as the lower electrode so as to make it possible to select a dielectric substance having a larger lattice constant at the occasion of forming the dielectric substance on the surface of the lower electrode.

With respect to the growth azimuth at the occasion of epitaxially growing any of these perovskite dielectric substances on a substrate in this invention, the growth of the perovskite dielectric substance should preferably be controlled such that the (100) face of the perovskite dielectric substance becomes parallel with the (100) face of a conductive substrate. Further, when the conductive substrate employed in this case is the one which has been epitaxially grown in advance on the surface of another substrate and, due to a mismatching of lattice constant between the conductive substrate and said another substrate, a strain is already introduced into the conductive substrate, the aforementioned range regarding "$a_s$" should be based not on the lattice constant inherent to the conductive material but on the lattice constant in the in-plane direction of the conductive material having a strain due to the epitaxial growth thereof.

In addition to the conditions on the relationship regarding the lattice constant between the lower electrode and the dielectric material, if a conductive perovskite type oxide is employed as an upper electrode, it is possible to obtain a still larger dielectric constant, or to obtain a still larger residual polarization in the case of ferroelectric substance.

As for the method of forming a dielectric film, a reactive vapor deposition, an RF sputtering, a MOCVD method, a laser ablation and a sol-gel method may be employed. Among these methods, a sputtering method is most preferable in view of easiness in introducing a strain.

This invention will be explained further with reference to the following various examples.

(EXAMPLE 1)

FIG. 1 shows a cross-sectional view schematically illustrating a thin film capacitor according to a first example of this invention. In this example, $SrRuO_3$ is employed as a material for the lower electrode, and a $Ba_{0.12}Sr_{0.88}TiO_3$ film is employed as a dielectric substance. The lattice constant inherent to the $SrRuO_3$ bulk is about 0.393 nm. The $Ba_{0.12}Sr_{0.88}TiO_3$ is known to be inherently formed of a perovskite type structure belonging to a cubic system at room temperature, the lattice constant inherent to the bulk thereof being; $a_0=0.3915$ nm.

The $SrRuO_3$ film 2 constituting the lower electrode and the $Ba_{0.12}Sr_{0.88}TiO_3$ film 3 constituting the dielectric film were successively heteroepitaxially grown on a $SrTiO_3$ (100) substrate (10 mm×10 mm) 1 by means of an RF magnetron sputtering method. The conditions for depositing these films including a Pt film 4 constituting an upper electrode are shown in the following Table 1.

The formation of the $Ba_{0.12}Sr_{0.88}TiO_3$ film 3 was performed by way of two-source sputtering using a $BaTiO_3$ sintered target and a $SiTiO_3$ sintered target. Two kinds of dielectric films were formed taking a sputtering time of 30 minutes and 60 minutes respectively, and the film thickness of each dielectric film was measured using a step meter, finding out the film thickness thereof as being 39 nm and 77 nm, respectively.

TABLE 1

(Sputtering conditions for electrodes and dielectric film)

|  | Lower electrode | Dielectric film | Upper electrode |
|---|---|---|---|
| electrode Target | $SrRuO_3$ | $BaTiO_3$; $SrTiO_3$ | Pt |
| Temp. of Substrate heating | 600° C. | 600° C. | No |
| Gas | $Ar:O_2 = 40:10$ sccm | $Ar:O_2 = 40:10$ sccm | $Ar:O_2 = 45:5$ sccm |
| Pressure | 0.7 Pa | 0.7 Pa | 0.7 Pa |
| Distance | 85 mm | 140 mm | 140 mm |
| RF power | 300 W | 80 W:375 W | 300 W |
| Time | 60 min. | 30 min. (t = 39 nm) 60 min. (t = 77 nm) | 10 min. |
| Reverse sputtering | 120 W, 5 min. Ar = 50 sccm | None | None |
| Pre-sputtering | 300 W, 15 min. | 30 min. | 300 W, 3 min |

The results on the analysis of the composition of the $Ba_{0.12}Sr_{0.88}TiO_3$ film having a film thickness of 77 nm which has been formed as mentioned above are shown in the following Table 2. This analysis was performed by means of an ICP emission spectral analysis. Since $SrRuO_3$ was employed as the lower electrode, the dissolution of the film was performed by using an etching solution comprising a mixture of aqueous ammonia, hydrogen peroxide and EDTA. The composition was: about 0.12 in Ba/(Ba+Sr) ratio, and about 1.06 in (Ba+Sr)/Ti ratio.

TABLE 2

(Results of composition analysis)

| Film thickness | Ba | Sr | Ti | Ba/(Ba + Sr) | (Ba + Sr)/Ti |
|---|---|---|---|---|---|
| 77 nm | 0.122 | 0.908 | 0.971 | 0.12 | 1.061 |

Figure 2:
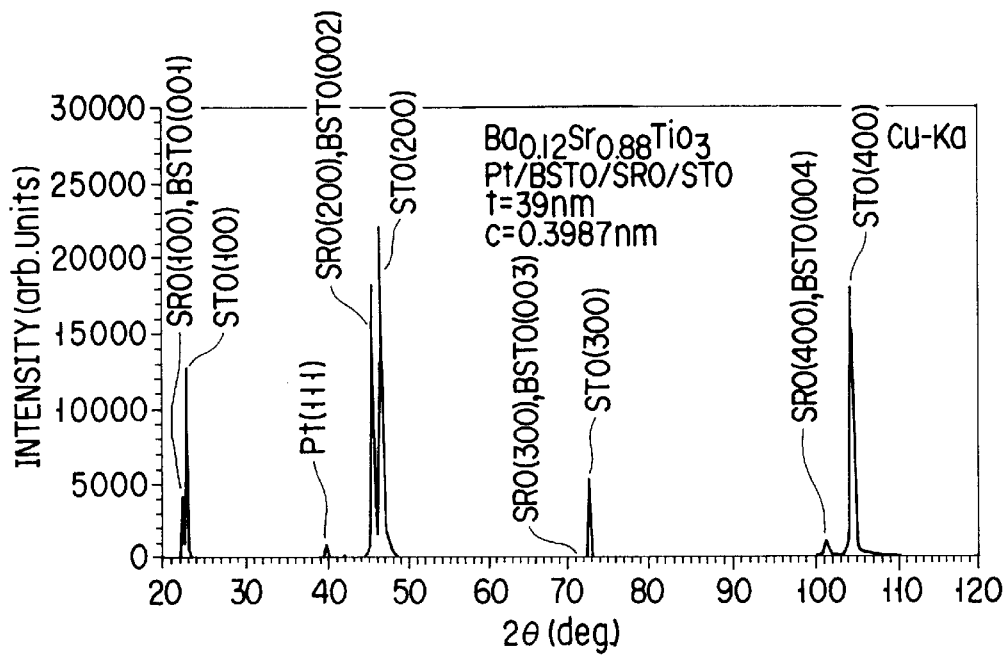
FIG. 2 is a graph showing an X-ray diffraction pattern of a $Ba_{0.12}Sr_{0.88}TiO_3$ film (film thickness: 39 nm)

FIG. 2 shows a result of an X-ray diffraction (θ2θ method) of a $Ba_{0.12}Sr_{0.88}TiO_3$ film having a film thickness of 39 nm. In addition to the diffraction peak from the $SrTiO_3$ employed as the substrate, peaks from the $SrRuO_3$ employed as the lower electrode as well as from the $Ba_{0.12}Sr_{0.88}TiO_3$ constituting the dielectric film were assumed to have been observed integrally (i.e. without being separated). The peaks are all confined to those derived from the (001) faces, indicating an excellent crystal orientation.

The lattice constant obtained from the X-ray diffraction was the same in both $SrRuO_3$ film and $Ba_{0.12}Sr_{0.88}TiO_3$ film, i.e. the lattice constant "a" in the direction parallel with the surface of the film was 0.3905 nm and the lattice constant "c", in the direction perpendicular to the surface of film was 0.3988 nm. Namely, the lattice constant of the surface of a conductive substrate on which the $Ba_{0.12}Sr_{0.88}TiO_3$ film was allowed to grow, i.e. the lattice constant of the surface of the $SrRuO_3$ film was: $a_s$=0.3905 nm.

Therefore, there has been a relationship of $a_0/a_s$=1.0025 between the lattice constant inherent to the dielectric material ($a_0$=0.3915 nm) and the lattice constant of the surface of the substrate ($a_s$), indicating the presence of lattice mismatching. On the other hand, there has been a relationship of $a/a_s$=1.00 between the lattice constant in the direction parallel with the surface of the dielectric material after deposition (a=0.3905 nm) and the lattice constant of the surface of the substrate (as), indicating a growth of the dielectric film without accompaniment of relaxation in lattice constant in the direction parallel with the surface of film.

When the changes of the unit lattice volume of the dielectric film were compared, it was found that the unit lattice volume $V_0$ as calculated from the symmetric (cubic system) lattice constant ($a_0$=0.3915 nm) inherent to $Ba_{0.12}Sr_{0.88}TiO_3$ was 0.06001 $nm^3$, whereas the unit lattice volume V of the $Ba_{0.12}Sr_{0.88}TiO_3$ film after the epitaxial growth thereof was 0.06081 $nm^3$, indicating that the changes of the unit lattice volume $V/V_0$ was 1.013.

Figure 3:
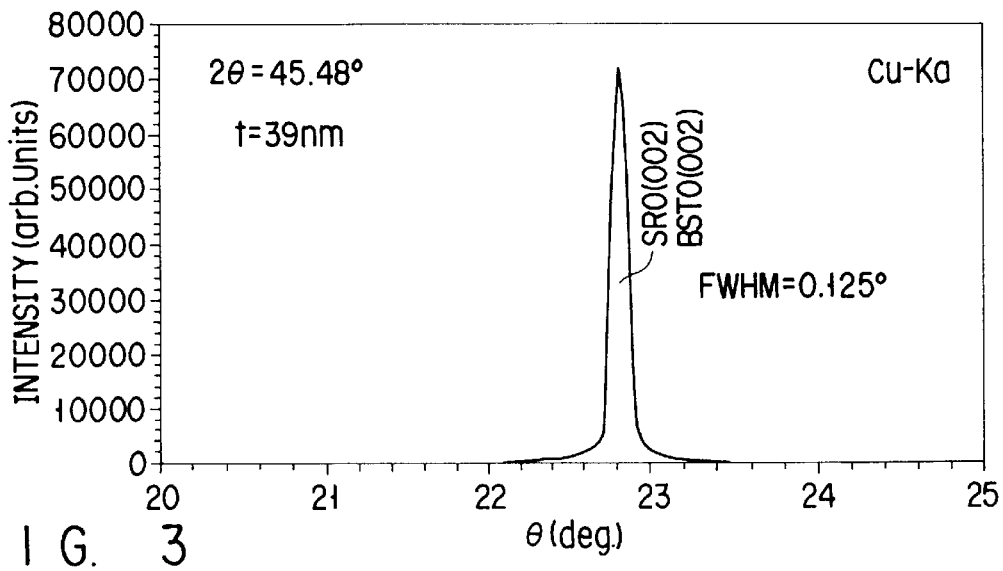
FIG. 3 is a graph showing a rocking curve on the (002) face of a $Ba_{0.12}Sr_{0.88}TiO_3$ film (film thickness: 39 nm)

FIG. 3 shows a rocking curve related to a diffraction peak which is assumed to include both $SrRuO_3$ (002) and $Ba_{0.12}Sr_{0.88}TiO_3$ (002) faces. The half-value width (FWHM) thereof is about 0.125°, indicating an excellent crystallinity of both $SrRuO_3$ and $Ba_{0.12}Sr_{0.88}TiO_3$ films.

Figure 4:
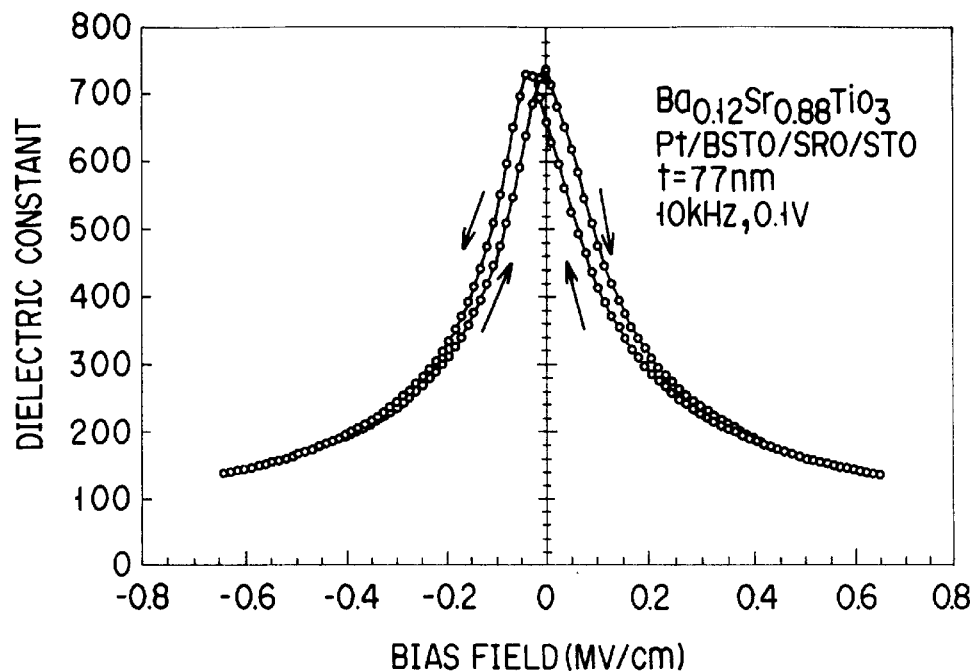
FIG. 4 is a graph showing a bias field dependence of dielectric constant of a $Ba_{0.12}Sr_{0.88}TiO_3$ film (film thickness: 77 nm)
Figure 5:
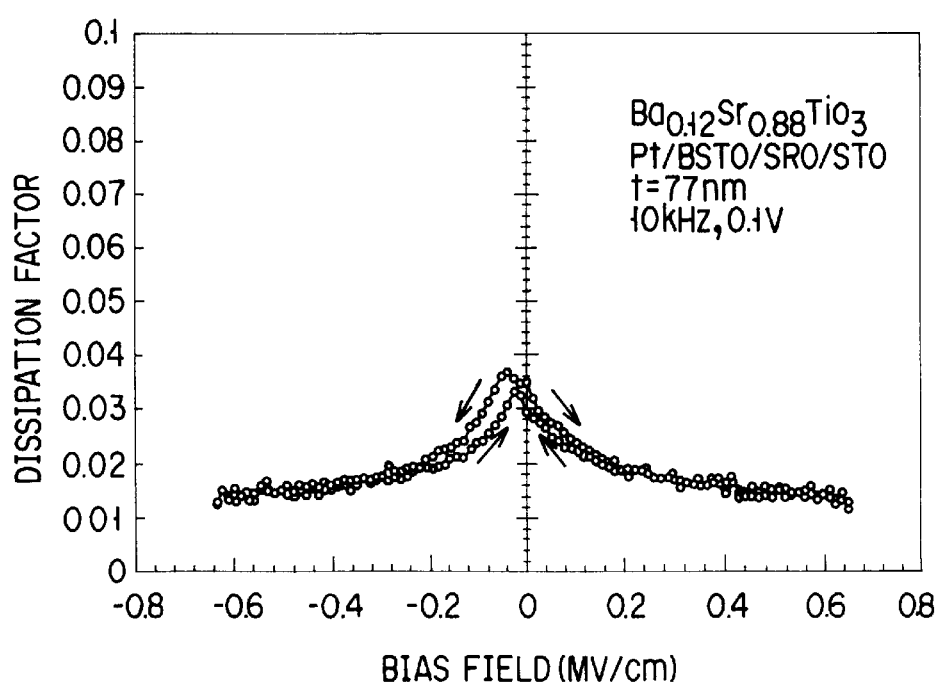
FIG. 5 is a graph showing a bias field dependence of dielectric loss of a $Ba_{0.12}Sr_{0.88}TiO_3$ film (film thickness: 77 nm)

FIG. 4 shows a bias field dependence of relative dielectric constant of a $Ba_{0.12}Sr_{0.88}TiO_3$ film having a thickness of 77 nm, and FIG. 5 shows a bias field dependence of dielectric loss of the $Ba_{0.12}Sr_{0.88}TiO_3$ film. The measurement of these data was performed using an LCR meter under the conditions of 10 kHz and 0.1 V. It will be seen from FIGS. 4 and 5 that both a dielectric constant and dielectric loss become maximum when the bias field is nearly zero and decrease with an increase of the bias field. The decrease of the relative dielectric constant is assumed to be brought about by the saturation of polarization. The maximum value of the dielectric constant was about 740, and the $SiO_2$-equivalent film thickness as calculated assuming the relative dielectric constant of $SiO_2$ as being 4 was about 0.42 nm.

Figure 6:
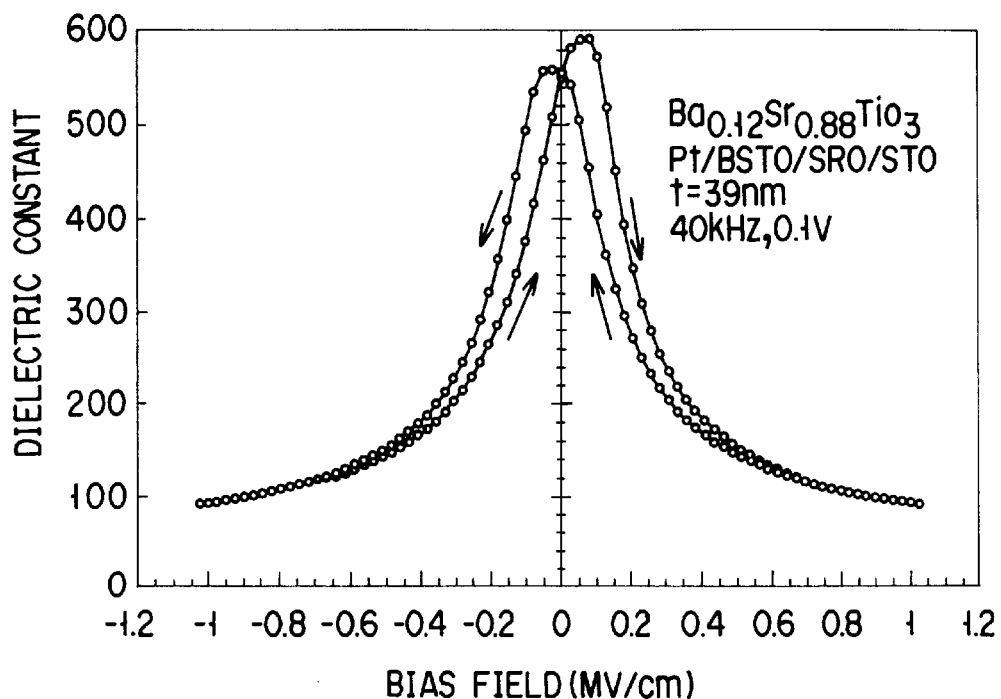
FIG. 6 is a graph showing a bias field dependence of dielectric constant of a $Ba_{0.12}Sr_{0.88}TiO_3$ film (film thickness: 39 nm)
Figure 7:
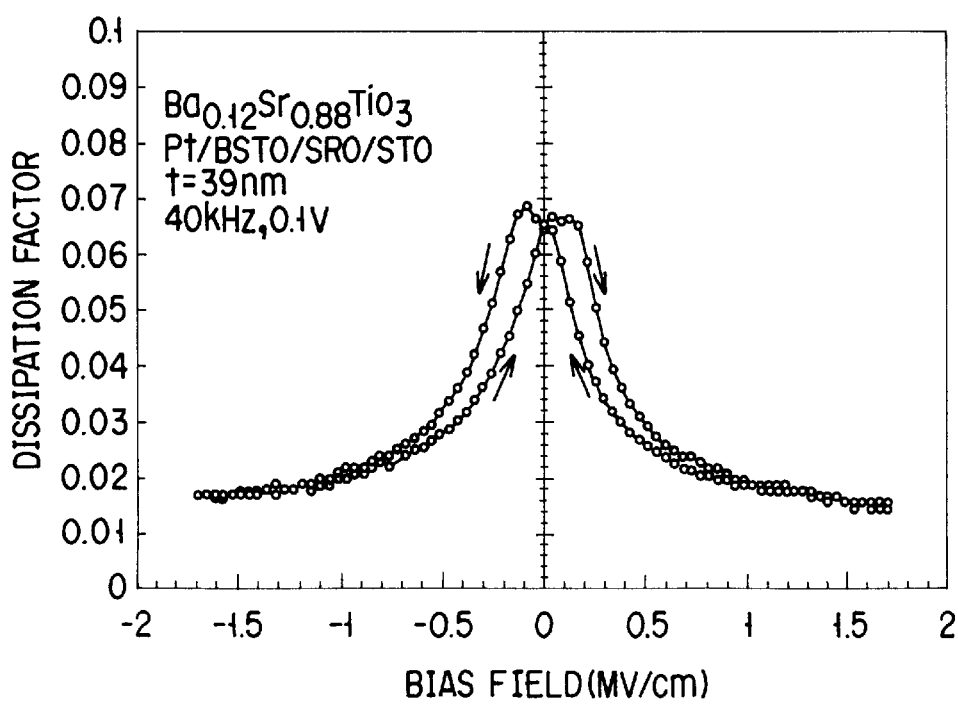
FIG. 7 is a graph showing a bias field dependence of dielectric loss of a $Ba_{0.12}Sr_{0.88}TiO_3$ film (film thickness: 39 nm)

FIGS. 6 and 7 show a bias field dependence of both a relative dielectric constant and dielectric loss factor of a $Ba_{0.12}Sr_{0.88}TiO_3$ film having a thickness of 39 nm. The measurement of these data was performed using an LCR meter under the conditions of 40 kHz and 0.1 V. It can be seen from these FIGS. that the maximum value of the dielectric constant is about 590, and the relative dielectric constant decreases with a decrease in film thickness. However, the $SiO_2$-equivalent film thickness was about 0.26 nm, and the quantity of accumulated electric charge was increased with a decrease in film thickness.

FIG. 8 shows a temperature dependence of both a dielectric constant and dielectric loss factor of $Ba_{0.12}Sr_{0.88}TiO_3$ films each having a thickness of 39 nm or 77 nm. The measurement of these data was performed at a frequency of 1 kHz by raising the temperature from room temperature to 200° C. It can be seen from FIG. 8 that the relative dielectric constant in both films 77 nm and 39 nm in thickness was decreased with an increase in temperature. Therefore, it is assumed that the ferroelectric phase transition temperature (Curie temperature) is lower than room temperature. The change with temperature of dielectric constant was found to be prominent in the case of the thick film having a thickness of 77 nm, but found to be mild in the case of the thin film having a thickness of 39 nm. The difference in a relative dielectric constant in relative with the film thickness at room temperature was found to be prominent, but this difference was prone to decrease with an increase in temperature.

The behavior of temperature dependence of these relative dielectric constant and dielectric loss factor is similar to that of the temperature dependence of dielectric constant which exhibits as an electric field is applied thereto. Namely, the difference in dielectric constant in the vicinity of the Curie temperature can be attributed to the large presence or absence of electric field is large. However, when the temperature is changed remote from the Curie temperature, the magnitude of dielectric constant per se is minimized and at the same time the difference in dielectric constant due to the presence or absence of electric field is also minimized. Therefore, the decrease in the relative dielectric constant due to a decrease in film thickness may be explained by assuming that an internal electric field existed inside the film in the case of thin film (or an electric field is existed near an electrode).

The dielectric loss is about 2% when the temperature of the film is in the range of 100° C. or less, and this loss is substantially maintained irrespective of changes in temperature in this range. However, when the temperature is increased to 150° C. or more, this dielectric loss tends to increase gradually in proportion with an increase in temperature. The thinner the film thickness is, the more prominent the increase of this dielectric loss. It is expected that some kind of conductive carrier is excited with an increase in temperature, thereby possibly promoting the dielectric loss. It is also expected that the thinner the film is, the higher the density of carrier is.

FIG. 9 shows a frequency dependence of both a dielectric constant and dielectric loss factor of $Ba_{0.12}Sr_{0.88}TiO_3$ films each having a thickness of 39 nm or 77 nm. It can be seen from FIG. 9 that the relative dielectric constant in both films 77 nm and 39 nm in thickness was gradually decreased with an increase in frequency as far as a frequency region of 100 kHz or less is concerned. Additionally, a phenomenon of dielectric dispersion can be seen. In this range of frequency, the dielectric loss was kept substantially constant with a value of 2%.

When the frequency was raised to 100 kHz or more, the dielectric loss increased abruptly, and at the same time the relative dielectric constant decreased. The reason for this is assumed to have been brought about by the effect of the resistance component of $SrRuO_3$ which has been introduced in series into the capacitor, i.e. the effect of the resistance component to rate-determine the charge/discharge of the capacitor in a high frequency region. This assumption is supported by the fact that when the frequency was plotted by making use of a linear scale, the dielectric loss was found to be substantially proportional to the frequency in this high frequency region.

Figure 10:
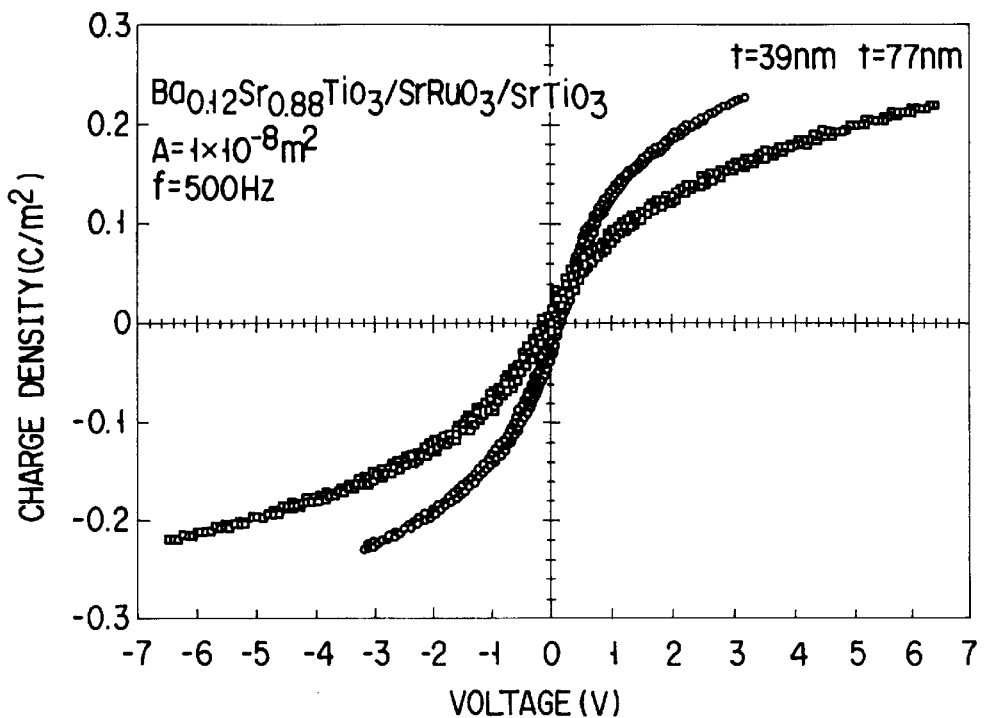
FIG. 10 is a graph illustrating a relationship between the density of accumulated charge and voltage in $Ba_{0.12}Sr_{0.88}TiO_3$ films (film thickness: 39 nm and 77 nm)

FIG. 10 illustrates changes (D-V curve) in charge density accumulated in a capacitor when an ac voltage (500 Hz, a chopping wave) is impressed to the capacitor comprising as a dielectric film a $Ba_{0.12}Sr_{0.88}TiO_3$ film, the thickness thereof being either 39 nm or 77 nm. The measurement in this case was performed by making use of a modified Soyer-Tower circuit which was manufactured using an operational amplifier.

As seen from FIG. 10, the inclination is steep in the vicinity of zero volt, which corresponds to the large value of the dielectric constant. Irrespective of film thickness, the charge density tends to saturate as the voltage is increased. A hysteresis was observed slightly at the moment of rise and drop of the voltage. However, the reason for this cannot be assured by this measurement if it was caused by the ferro-electricity or by a leakage current.

Figure 11:
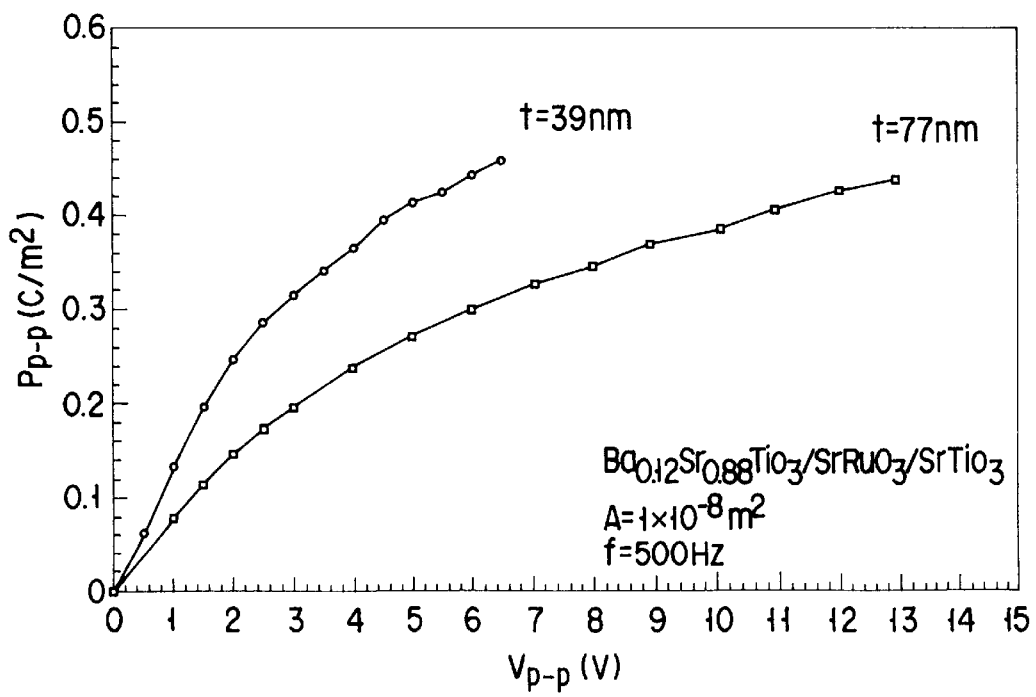
FIG. 11 is a graph illustrating a relationship between the measuring voltage amplitude and the charge amplitude in $Ba_{0.12}Sr_{0.88}TiO_3$ films (film thickness: 39 nm and 77 nm)

FIG. 11 shows a relationship between the ac voltage amplitude (peak to peak) and the accumulated charge amplitude (peak to peak) in $Ba_{0.12}Sr_{0.88}TiO_3$ films, the thickness thereof being 39 nm and 77 nm. When a $Ba_{0.12}Sr_{0.88}TiO_3$ film having a thickness of 39 nm is compared with the film having a thickness of 77 nm, the former film (a thin film) indicates a steep rise in quantity of charge in a low voltage region, suggesting an effect by a thinning of the film. As for the $Ba_{0.12}Sr_{0.88}TiO_3$ film having a thickness of 39 nm, it indicated an accumulated charge amplitude of about 0.2 $C/m^2$ when the voltage amplitude was 1.5 $V_{p-p}$. When the equivalent value of the film thickness is calculated, on the basis of this value, assuming the relative dielectric constant of $SiO_2$ as being 4, an equivalent film thickness of about 0.265 nm can be obtained. The value is almost the same as that of the value of the film thickness estimated from the maximum value of the relative dielectric constant that can be derived from the bias field dependency of the relative dielectric constant.

As far as a film of high dielectric constant is concerned, the bias field dependency of the relative dielectric constant is generally high. Therefore, with a view of the application of this dielectric film to a DRAM, the value of $SiO_2$-equivalent film thickness as calculated from the measurement value of the accumulated charge is assumed to be more reasonable to adopt.

If this dielectric film is to be applied to a DRAM, the changes in accumulated charge in relative to pulse are required to be investigated. FIGS. 12A and 12B show the wave profile of an ac pulse (a) and the wave profile of a charge/discharge current to a capacitor (b). In this case, the pulse voltage was controlled to −1 V to +1 V in amplitude, and the cycle was set to 10 μs. The current wave profile was obtained by connecting a resistance of 100Ω (ohm) in series to the capacitor and by monitoring the voltages of both sides. The voltage and current wave profiles were monitored by making use of a digital oscilloscope.

Since the charge/discharge current wave profile has been sufficiently attenuated at the moment of 1,000 ns, the integral time for determining the quantity of charge was set to about 2,000 ns. The capacity of the sample was about 1 nF.

FIG. 13 shows the changes of accumulated charge thus measured as a function of the number of repetition cycles of pulse applied. As seen from FIG. 13, the quantity of accumulated charge is about 0.24 $C/m^2$, which is almost the same as that of charge density when the voltage amplitude shown in FIG. 11 was 2 $V_{p-p}$ (the reason for indicating a slightly small value is assumed to be attributed to the influence from the measuring frequency). The changes in quantity of charge were investigated by impressing a pulse up to $10^9$ times, but any substantial deterioration in quantity of charge was not admitted within this range.

Figure 14:
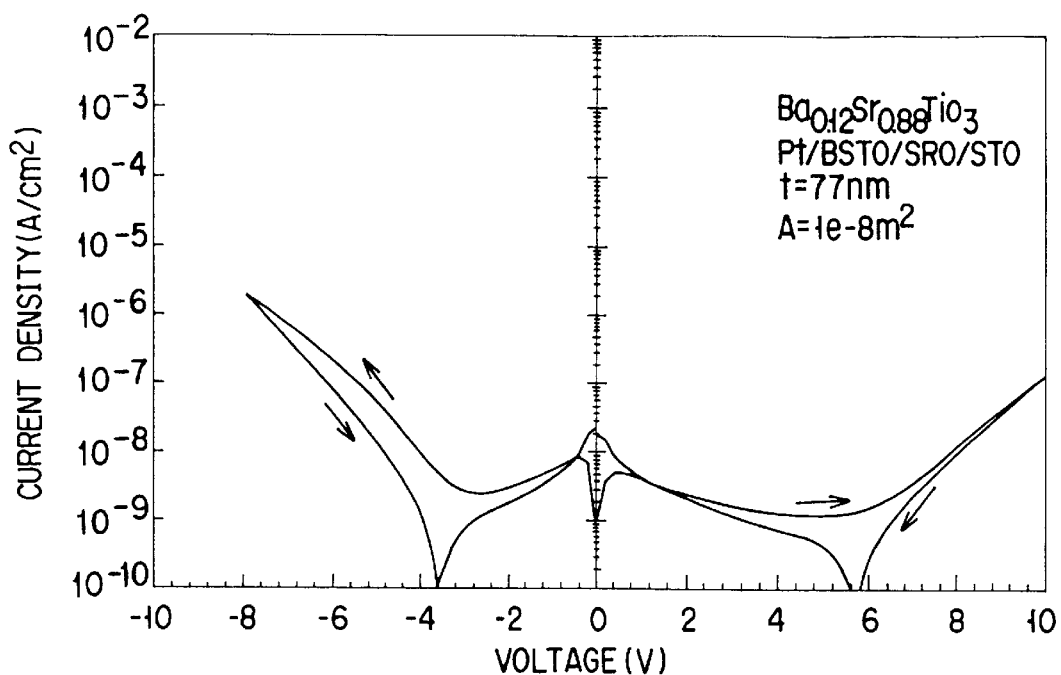
FIG. 14 is a graph showing the current and voltage characteristics of a $Ba_{0.12}Sr_{0.88}TiO_3$ film (film thickness: 77 nm)
Figure 15:
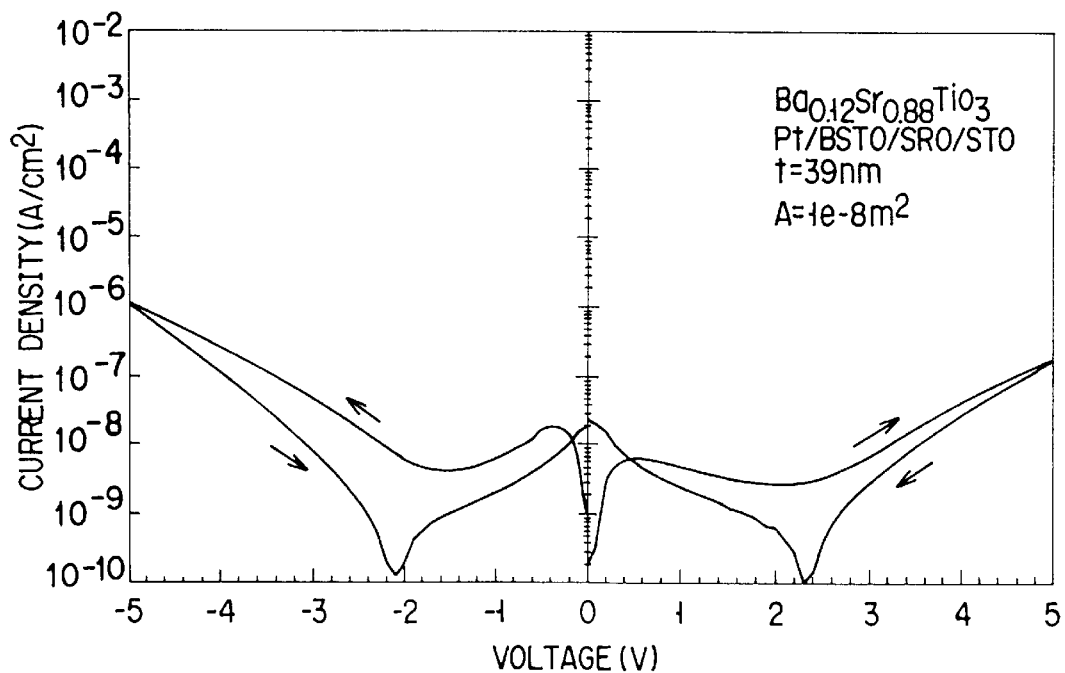
FIG. 15 is a graph showing the current and voltage characteristics of a $Ba_{0.12}Sr_{0.88}TiO_3$ film (film thickness: 39 nm)

FIGS. 14 and 15 show the current density-voltage characteristics (J-V characteristics) of $Ba_{0.12}Sr_{0.88}TiO_3$ films, the thickness thereof being 39 nm and 77 nm. As seen from FIGS. 14 and 15, a phenomenon of current reduction was observed together with the drop of voltage in a low voltage region. This current reduction is assumed to have been brought about by an absorption current. The reason for indicating a large absorption current at a lower voltage region may be attributed to a large distribution of a dielectric constant in the film due to a large dielectric constant. The voltage range indicating a current density of $1 \times 10^{-8} A/cm^2$ or less, which is considered to be a standard for the application to a DRAM, is about 11.5 V ranging from −4 V to +7.5 V in the case of the film having a thickness of 77 nm; and about 5.5 V ranging from −2.3 V to +3.2 V in the case of the film having a thickness of 39 nm.

It is known that when a dc voltage is applied to a dielectric film for a long period of time, the insulation resistance of the film is gradually deteriorated. FIGS. 16A and 16B show changes with time of a leakage current when a positive voltage (a) as well as a negative voltage (b) of dc current are applied to a $Ba_{0.12}Sr_{0.88}TiO_3$ film having a thickness of 39 nm. Although voltages of +5 V and −5 V correspond respectively to an electric field strength of about 1.3 MV/cm, any substantial increase in leakage current was not observe even if the measurement was continued for 30 minutes as seen from FIGS. 16A and 16B.

Figure 17:
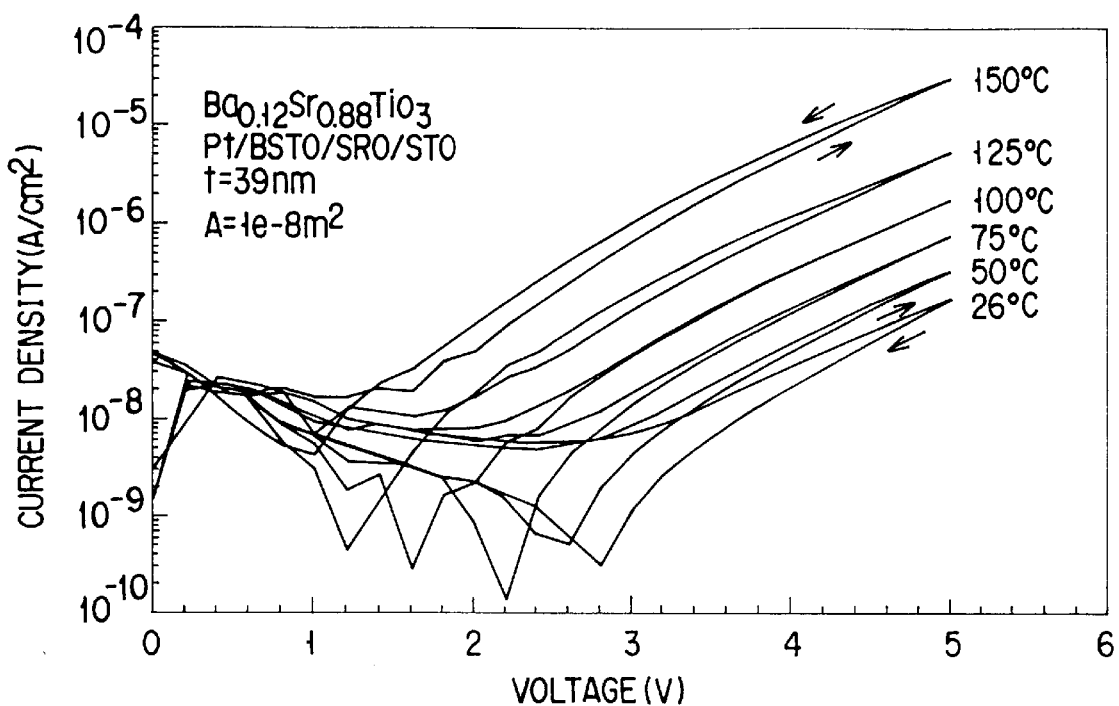
FIG. 17 is a graph illustrating a temperature dependence of leakage current of a $Ba_{0.12}Sr_{0.88}TiO_3$ film (film thickness: 39 nm)

FIG. 17 shows a relationship between a leakage current density and voltages in a case where the temperature of a $Ba_{0.12}Sr_{0.88}TiO_3$ film having a thickness of 39 nm was changed from room temperature to 150° C. As seen from FIG. 17, the leakage current indicated a tendency to increase as the temperature was raised higher in a higher voltage region, thus suggesting that the conduction of a leakage current was governed by the number of carriers which have been thermally excited. However, the relationship between the inverse number of the absolute temperature (1/T) and the current density was not necessarily indicated as been linear. This suggests that the number of the conductive carrier is not dependent only on the probability of thermal excitation.

A difference in value of leakage current density was admitted at the moments of the rise and drop of the voltage. On the low temperature side, the value of leakage current at the moment of voltage drop was relatively small as compared with that at the moment of voltage rise. It is considered that at the moment of voltage rise, the so-called absorption current is superimposed on the leakage current, thereby indicating a somewhat larger measured value, but the absorption current is absorbed at the moment of voltage drop to release electric charge, thereby being superimposed as a current which is inverse to the leakage current.

On the other hand, on the high temperature side, the leakage current density increased more prominently at the moment of voltage drop than at the moment of voltage rise. The reason for this phenomenon is not yet made clear, but there is a possibility that a resistance deterioration has been promoted at a high temperature by a voltage during the measurement.

Figure 18:
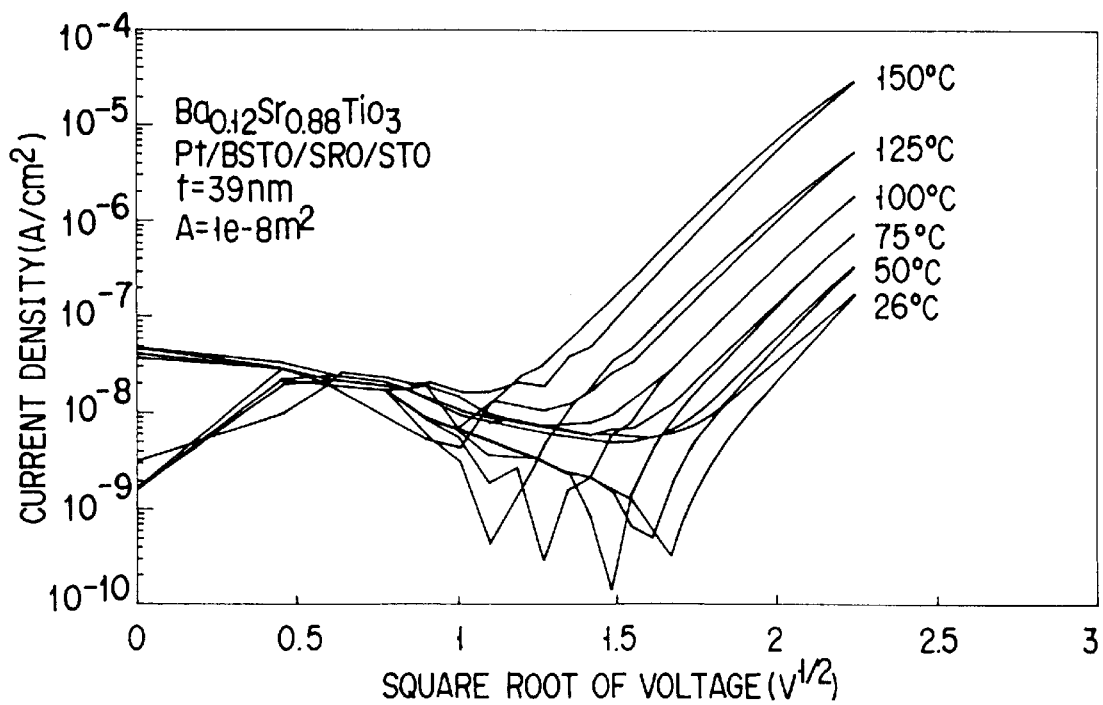
FIG. 18 is a graph illustrating a relationship between the square root of voltage and the current density.

FIG. 18 shows a relationship between the square root of voltage indicated on the abscissa axis and the current density. As seen from FIG. 18, there is a linear relationship between the square root of voltage and the current density in the high voltage region, which can be explained by the Schottky emission model or Pool-Fenkel type conduction where conductive carriers are excited overcoming the Coulomb potential.

The inclination of this line can be substantially maintained irrespective of temperature change. The change in number of carrier to be excited by temperature cannot be explained by a phenomenon of simple thermal excitation, but the shape of potential by which the carrier is restrained is always the same, i.e. the kinds of the carrier is the same.

Figure 19:
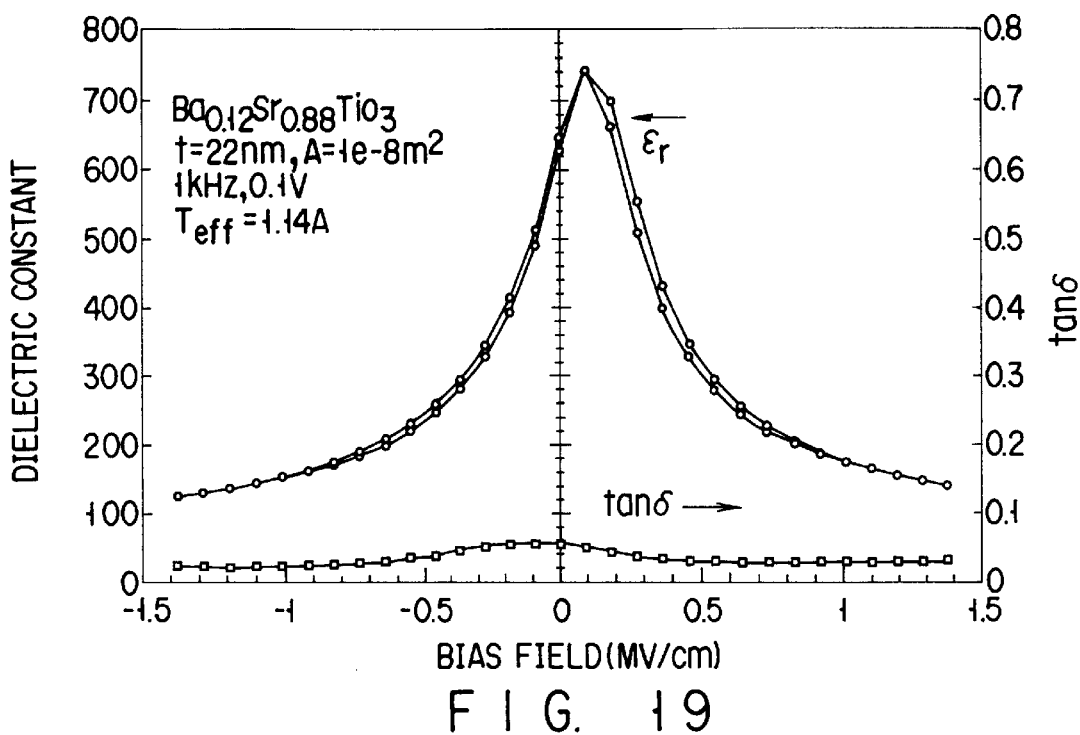
FIG. 19 is a graph illustrating an electric field dependence of dielectric constant and dielectric loss of $Ba_{0.12}Sr_{0.88}TiO_3$ film when an $SrRuO_3$ film is formed as an upper electrode on a $Ba_{0.12}Sr_{0.88}TiO_3$ film (film thickness: 23 nm)

The followings are an example where an $SrRuO_3$ film is employed as an upper electrode 14 in Example 1. FIG. 19 shows an electric field dependence of dielectric constant and dielectric loss of $Ba_{0.12}Sr_{0.88}TiO_3$ film when an $SrRuO_3$ film is formed as an upper electrode on a $Ba_{0.12}Sr_{0.88}TiO_3$ film (film thickness: 23 nm) in the same manner as explained above. Although the $Ba_{0.12}Sr_{0.88}TiO_3$ film is as thin as 23 nm, it was possible to obtain as a maximum relative dielectric constant a value of 700 or more. As clear from this result, although it is possible to improve the dielectric constant by controlling the relationship regarding the lattice constant between the lower electrode and the dielectric material, it is also possible to further improve the dielectric constant by employing a conductive perovskite type oxide as an upper electrode.

(Comparative Example 1)

This comparative example illustrates an embodiment where a Pt film is epitaxially grown as a lower electrode on a MgO (100) substrate, and then a $Ba_{0.24}Sr_{0.76}TiO_3$ film is epitaxially grown on the Pt film. The lattice constant inherent to the Pt film is 0.3923 nm. The $Ba_{0.24}Sr_{0.76}TiO_3$ inherently belongs to the cubic system, the lattice constant thereof being; $a_0$=0.393 nm.

The lattice constant of these films after the epitaxial growth thereof are as follows. Namely, in the case of the Pt film, the lattice constant in the direction parallel with the surface thereof ($a_s$) was 0.3915 nm, whereas the lattice constant in the direction perpendicular to the surface thereof ($c_s$) was 0.3935 nm. In the case of the $Ba_{0.24}Sr_{0.76}TiO_3$ film, the lattice constant in the direction parallel with the surface thereof (a) was 0.3925 nm, whereas the lattice constant in the direction perpendicular to the surface thereof (c) was 0.4001 nm.

However, the lattice constant inherent to this $Ba_{0.24}Sr_{0.76}TiO_3$ film is: $a_0$=0.393 nm, so that the ratio thereof in relative to the lattice constant ($a_s$=0.3915 nm) of the substrate: $a_0/a_s$ is 1.004.

When the changes of the unit lattice volume of the dielectric film are compared, it will be found that the unit lattice volume $V_0$ inherent to the cubic system is 0.06069 $nm^3$, whereas the unit lattice volume (V=$a^2c$) of the film after the epitaxial growth thereof is 0.06163 $nm^3$, indicating that the ratio of changes of the unit lattice volume $V/V_0$ is 1.015. This seems to indicate that due to the lattice mismatch of the film to the lower electrode and due to the expansion of the unit lattice volume, the crystal structure of the film which belongs inherently to a cubic system was distorted toward the tetragonal system, the lattice constant thereof in the film-thicknesswise direction being extended.

However, when the lattice constant of the film in the direction parallel with the surface thereof is compared with that of the lower electrode, it will be found that the lattice constant as of the lower electrode (Pt) in the direction parallel with the surface thereof is 0.3915 nm, whereas the lattice constant (a) in the direction parallel with the surface of the film after the epitaxial growth thereof is 0.3925 nm, indicating that the ratio of lattice constant $a/a_s$ representing the degree of relaxation is 1.0025. This relaxation in the strain of the crystal is one of the differences between the Comparative Example 1 and the Example 1.

Figure 20:
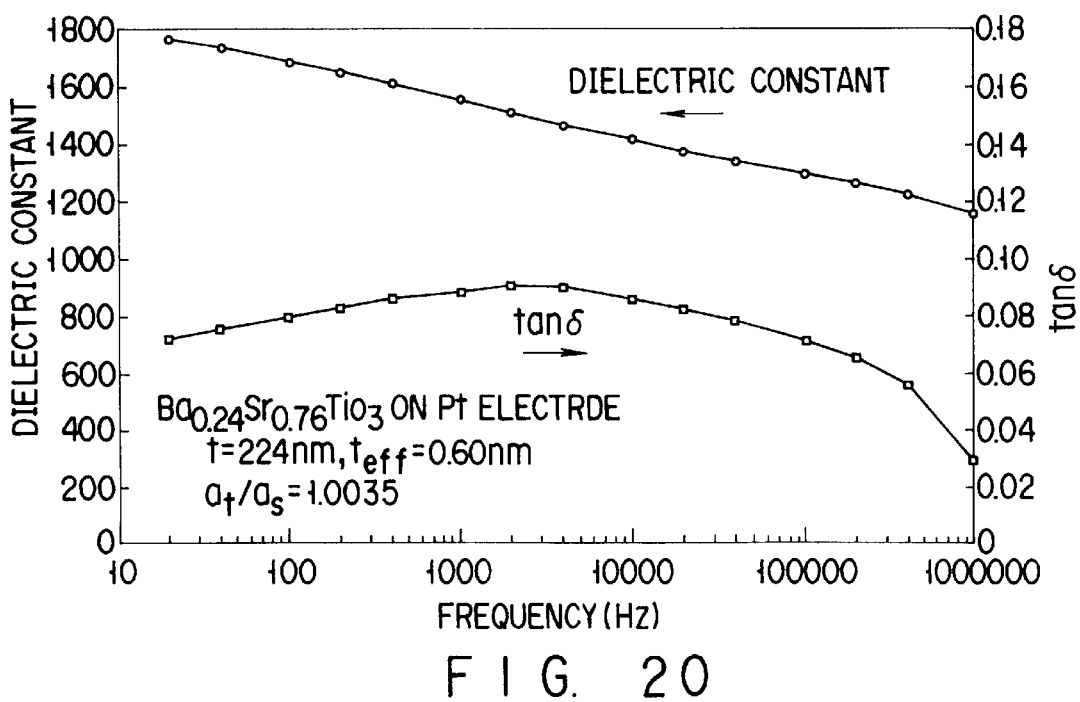
FIG. 20 is a graph showing a frequency dependence of relative dielectric constant and dielectric loss of $Ba_{0.24}Sr_{0.76}TiO_3$ films in Comparative Example 1.

FIG. 20 shows a frequency dependence of dielectric constant and dielectric loss of the $Ba_{0.24}Sr_{0.76}TiO_3$ film prepared according to Comparative Example 1. This $Ba_{0.24}Sr_{0.76}TiO_3$ film according to Comparative Example 1 exhibits a prominently large frequency dependence of dielectric constant, and also indicates a large value of dielectric loss, i.e. 6 to 8% throughout the wide range of frequency. The cause for such a frequency dispersion of dielectricity may be ascribed to the relaxation of distortion, i.e. to the presence of dielectric constant distribution, electric conductivity distribution, or both of these distributions in the interior of the dielectric film. This relaxation in distortion of lattice constant is generally observed prominently in a dielectric film having a strain induced due to a mismatching in lattice constant.

Figure 21:
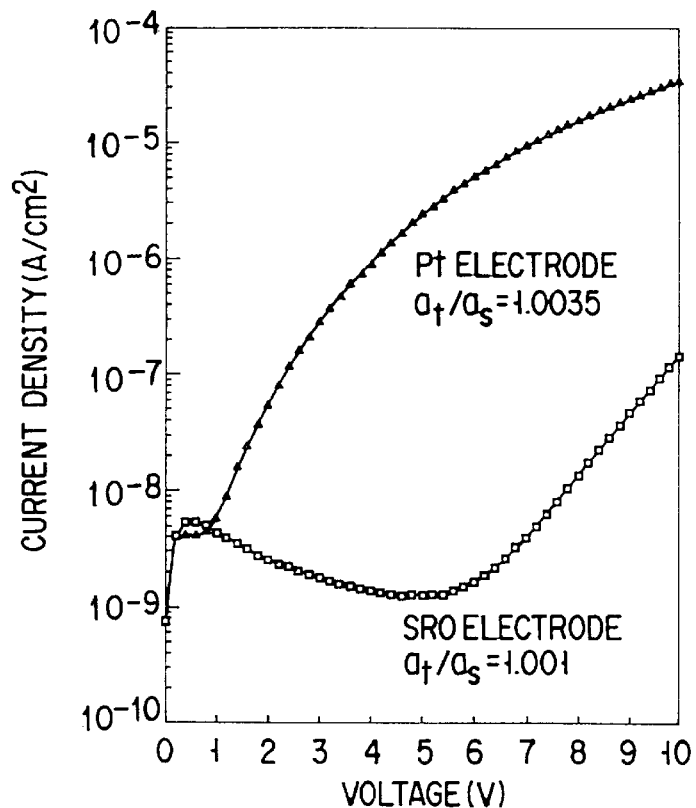
FIG. 21 is a graph illustrating the leakage current characteristic of a $Ba_{0.12}Sr_{0.88}TiO_3$ film in Example 1 as compared with that in Comparative Example 1.

FIG. 21 illustrates a comparison between the leakage current characteristic of the $Ba_{0.24}Sr_{0.76}TiO_3$ film prepared according to Comparative Example 1 and the leakage current characteristic of the $Ba_{0.12}Sr_{0.88}TiO_3$ film of Example 1. It will be seen that the dielectric film of Comparative Example 1 exhibiting a relatively large relaxation of distortion indicates a larger leakage current as compared with the dielectric film of Example 1 exhibiting a relatively small relaxation of distortion. The reason for the generation of large leakage current in the film exhibiting a relatively large relaxation of distortion is assumed to be attributed to the fact that a crystal dislocation tends to be introduced into the film as a result of relaxation of distortion, this dislocation functioning as a source for the conductive carrier.

(EXAMPLE 2)

This example illustrates an embodiment which employs a dielectric thin film inherently having a lattice constant which is substantially equal to or smaller than the lattice constant of the surface of a lower electrode.

As shown in FIG. 1, a lower electrode 2 formed of a Pt film of cubic system, a perovskite dielectric film 3 formed of $SiTiO_3$ film and an upper electrode 4 patterned into a predetermined shape are successively deposited on a substrate 1 formed of MgO (100) single crystal to manufacture a thin film capacitor as explained in detail below.

First of all, a Pt target 4 inches in diameter was subjected to sputtering by way of an RF sputtering, thereby to form the lower electrode 2 consisting of Pt and having a thickness of 50 nm on the MgO (100) single crystal substrate 1. This sputtering was performed under the conditions: an atmosphere of Ar whose flow rate being 50 sccm, the temperature of substrate being set to 600° C. and the making RF power to the target being set to 300 W.

The Pt film 2 thus formed was evaluated by means of an X-ray and a reflective electron beam diffraction. As for the relationship in crystal orientation between the MgO substrate 1 and the Pt film 2, the MgO substrate 1 exhibited a crystal orientation of (100), while the Pt film 2 exhibited (100); likewise, the MgO substrate 1, [001], while the Pt film 2, [001], thus indicating that the Pt film 2 has been epitaxially grown.

Then, an $SiTiO_3$ sintered target 4 inches in diameter was subjected to sputtering by way of an RF sputtering, thereby to deposit the dielectric thin film 3 consisting of an $SiTiO_3$ (STO) and having a thickness of 80 nm on the lower electrode 2. This sputtering was performed as follows. Namely, at first an $Ar/O_2$ atmosphere was set to 40 sccm/10 sccm, the temperature of substrate to 600° C. and the making RF power to the target to 400 W, thereby forming a thin film having a thickness of 10 nm or less. Then, the $Ar/O_2$ atmosphere was replaced by an atmosphere of $O_2$=100 sccm, and the conditions for the temperature of substrate and the making power were maintained the same as mentioned above, thereby forming additional thin film having a thickness of 70 nm.

The reason for carrying out the sputtering in two steps is that if the deposition is performed under an atmosphere of $O_2$=100 sccm from the beginning, it is impossible to obtain an epitaxial film of STO due to a slight oxidation of the Pt surface.

The STO film 3 thus formed was evaluated by means of an X-ray diffraction and a reflective electron beam diffraction. As for the relationship in crystal orientation between the Pt film and the STO film, the Pt film exhibited a crystal orientation of (100), while the STO film exhibited (100); likewise, the Pt film, [001], while the STO film, [001]. When the lattice constant of $SiTiO_3$ film 3 was measured by means of an X-ray diffraction, the lattice constant "c" in the direction perpendicular to the surface of the film ([001]) was found as being 0.3981 nm, while the lattice constant "a" in the direction parallel with the surface of the film ([100]) was found as being 0.3888 nm, and hence c/a ratio being 1.02, thus indicating a structure of tetragonal system.

When the changes of the unit lattice volume of the dielectric film was investigated, it was found that the unit lattice volume $V_0$ as calculated from the symmetric (cubic system) lattice constant ($a_0$=0.3905 nm) inherent to $SiTiO_3$ was 0.05955 $nm^3$, whereas the unit lattice volume V of the $SiTiO_3$ film after the epitaxial growth thereof was 0.06018 $nm^3$, indicating that the changes of the unit lattice volume $V/V_0$ was 1.011.

Subsequently, a resist film of predetermined pattern was formed, and then a Pt film was deposited to a thickness of 100 nm by means of an RF sputtering method at room temperature. Then, the Pt film was patterned by means of a lift-off method to form the upper electrode 4, the size of the upper electrode 4 being set to 100 $\mu$m×100 $\mu$m.

(Comparative Example 2)

The procedures of Example 2 were repeated except that the perovskite dielectric film 3 formed of $SiTiO_3$ (STO) film and having a thickness of 80 nm was deposited on the lower electrode 2 without exchanging the atmosphere, i.e. only in the $Ar/O_2$ atmosphere of 40 sccm/10 sccm.

The STO film 3 thus formed was evaluated by means of an X-ray diffraction and a reflective electron beam diffraction. As for the relationship in crystal orientation between the Pt film 2 and the STO film 3, the Pt film exhibited a crystal orientation of (100), while the STO film exhibited (100); likewise, the Pt film, [001], while the STO film, [001].

When the lattice constant of $SiTiO_3$ film 3 was measured by means of an X-ray diffraction, the lattice constant "c" in the direction perpendicular to the surface of the film was found as being 0.3910 nm, while the lattice constant "a" in the direction parallel with the surface of the film was found as being 0.3915 nm, and hence c/a ratio being about 1.00, i.e. the structure of the cubic system was substantially maintained. Namely, unlike Example 2, any substantial distortion in crystal lattice of the STO film 3 was not recognized.

Meanwhile, the unit lattice volume V of the $SiTiO_3$ film after the epitaxial growth thereof was found to be 0.05993 $nm^3$, and the changes of the unit lattice volume $V/V_0$ was found to be 1.006. Thereafter, a thin film capacitor having a structure as shown in FIG. 1 was produced in the same manner as illustrated in Example 2.

Then, the electric characteristics of the thin film capacitors prepared in Example 2 and Comparative Example 2 were evaluated as follows.

Figure 22:
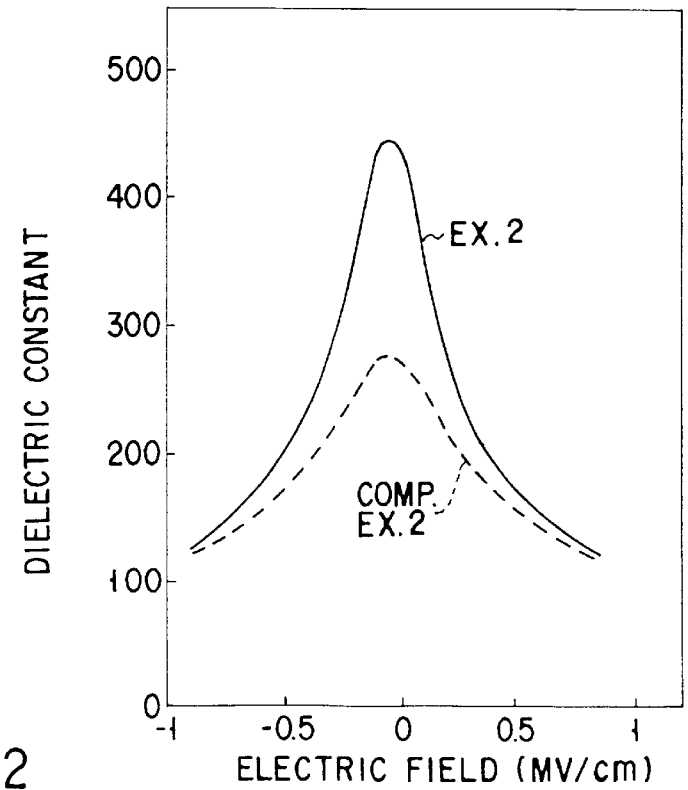
FIG. 22 is a graph illustrating the relative dielectric constant/electric field characteristic of thin film capacitors in Example 2 and Comparative Example 2.

FIG. 22 shows the relative dielectric constant/bias field characteristic of thin film capacitors at 300K. The relative dielectric constant of the thin film capacitor of Comparative Example 2 was 300, whereas the relative dielectric constant of the thin film capacitor of Example 2 was 450, which is higher than that of a bulk crystal (relative dielectric constant: about 350). The reason for this large relative dielectric constant which has been indicated by the $SiTiO_3$ film according to Example 2 can be explained as follows. Namely, since this $SiTiO_3$ film was deposited in an atmosphere comprising a high content of oxygen, the unit lattice volume was caused to expand due to the peening effect by oxygen, and hence the lattice constant of the surface of the film was restrained by the substrate of the lower electrode, whereby the crystal lattice was caused to extend in the direction perpendicular to the surface of the film, thus transforming the crystal structure into the tetragonal system.

FIG. 23 shows results on a temperature dependence of relative dielectric constant of the thin film capacitors of Example 2 and Comparative Example 2. The maximum relative dielectric constant was recognized at a temperature of around −50° C. in the case of the $SiTiO_3$ film of Example 2, and −150° C. in the case of the $SiTiO_3$ film of Comparative Example 2. As seen from this FIG., the $SiTiO_3$ film of Example 2 exhibited a large relative dielectric constant in a wide range of temperature in the vicinity of room temperature.

When the composition of the $SiTiO_3$ dielectric thin film was analyzed (the molar ratio of Sr and Ti), Sr/Ti ratio was found to be 1.01/0.99 in the case of the $SiTiO_3$ film of Example 2, and 1.04/0.96 in the case of the $SiTiO_3$ film of Comparative Example 2, thus indicating that the $SiTiO_3$ film of Example 2 is much more close to the stoichiometric composition.

(EXAMPLE 3)

This example illustrates an embodiment wherein this invention was applied to a ferroelectric thin film whose ferroelectricity was induced by way of a strain. In this case, the frequency characteristic of residual polarization in the ferroelectric thin film can be improved.

As shown in FIG. 1, a lower electrode 2 formed of a $Ba_{0.1}Sr_{0.9}RuO_3$ film having an orientation of (001) was deposited on a substrate 1 formed of $SiTiO_3$ (100) single crystal having a smooth surface by means of an RF magnetron sputtering method at a substrate temperature of 600° C. and in an atmosphere of Ar:$O_2$=40:10 (sccm) (entire pressure being about 0.6 Pa), thereby forming a conductive substrate of this Example. The film thickness of this $Ba_{0.1}Sr_{0.9}RuO_3$ film 2 was about 50 nm.

The $Ba_{0.1}Sr_{0.9}RuO_3$ film 2 thus formed was confirmed as being formed of a (001) orientation film having a perovskite type crystal structure by X-ray diffraction. It was further confirmed that, when the film was formed by means of sputtering method as mentioned above, the lattice constant in the direction perpendicular to the surface of the film was about 0.399 nm, while the lattice constant in the direction parallel with the surface of the film was about 0.3935 nm. Therefore, the $Ba_{0.1}Sr_{0.9}RuO_3$ film thus manufactured exhibits a crystal symmetry of tetragonal system, and is applicable as a lower electrode as defined by this invention.

The lattice constant parallel with the surface of the lower electrode ($a_s$) as defined by this invention can be represented by 0.3935 nm.

Then, a $BaTiO_3$ film having a thickness of about 200 nm was deposited as a ferroelectric film 3 on the $Ba_{0.1}Sr_{0.9}RuO_3$ film by means of an RF magnetron sputtering method. As for the sputtering target, a $BaTiO_3$ sintered body (4 inches in diameter and 5 mm in thickness) was used. The sputtering was performed by setting the substrate temperature to 600° C. employing a mixed gas atmosphere comprising argon (Ar) and oxygen ($O_2$) (Ar:$O_2$=40:10 (sccm)), and setting the distance between the substrate and the target to 140 mm. The RF power applied to the target was set to 600 W. The composition of the film thus formed was analyzed by means of an ICP method, finding these films as being very close to the stoichiometric composition.

In this case, the lattice constant of the $Ba_{0.1}Sr_{0.9}RuO_3$ film in the direction parallel with the surface thereof ($a_s$) was 0.3935 nm, whereas the inherent lattice constant of the a-axis of $BaTiO_3$ (tetragonal system) ($a_0$) is known to be about 0.3992 nm (the inherent lattice constant of the c-axis of $BaTiO_3$ is 0.4036 nm), and hence $a_0/a_s$ is 1.014. Therefore, this value falls within the range as defined by this invention, i.e. $1.002 \leq a_0/a_s \leq 1.015$.

Then, as Comparative Example 3, a ferroelectric film was formed in the same manner as in Example 3. Namely, a lower electrode formed of a $Ba_{0.1}Sr_{0.9}RuO_3$ film 2 having an orientation of (001) was deposited on a $SiTiO_3$ (100) single crystal substrate 1 having a smooth surface by means of an RF magnetron sputtering method at a substrate temperature of 600° C. (with other conditions being the same as in Example 3, thereby forming a conductive substrate of this Comparative Example. The film thickness of this $Ba_{0.1}Sr_{0.9}RuO_3$ film 2 was about 50 nm. The $Ba_{0.1}Sr_{0.9}RuO_3$ film 2 thus formed was confirmed by means of an X-ray diffraction as being formed of a (001) orientation film, exhibiting the same value as that of Example 3 in the lattice constant in the direction perpendicular to the surface of the film, i.e. about 0.3935 nm.

Then, a $BaTiO_3$ film having a thickness of about 200 nm was deposited as a ferroelectric film 3 on the $Ba_{0.1}Sr_{0.9}RuO_3$ film 2 by means of an RF magnetron sputtering method under different conditions from those of Example 3 as explained below. As for the sputtering target, a $BaTiO_3$ sintered body (4 inches in diameter and 5 mm in thickness) was used. The sputtering was performed by setting the substrate temperature to 600° C., employing a mixed gas atmosphere comprising argon (Ar) and oxygen ($O_2$) (Ar:$O_2$=40:10 (sccm)), and setting the distance between the substrate and the target to 170 mm. The RF power applied to the target was set to 400 W. Namely, this Comparative Example 3 differs in the sputtering condition from that of Example 3 in terms of the distance between the substrate and target, and the power applied, with other conditions being the same as those of Example 3, thereby forming the $BaTiO_3$ film.

These two kinds of $BaTiO_3$ films prepared by changing the sputtering condition (Example 3 and Comparative Example 3) were evaluated in detail with regard to the crystal orientation and the lattice constant by means of an X-ray diffraction method and the RHEED method. As a result, it has been confirmed that in both cases, a (001) orientation film of $BaTiO_3$ was formed on the surface of the $Ba_{0.1}Sr_{0.9}RuO_3$ (001) film in the same manner, and the orientation of the film in relative to the underlying $Ba_{0.1}Sr_{0.9}RuO_3$ film (the lower electrode) was indicated correlations of: BT ($BaTiO_3$) (100) vs BSR (($Ba,Sr)RuO_3$) (100); and BT (001) vs BSR (100).

However, as far as the lattice constant of the $BaTiO_3$ film is concerned, the differences as shown in the following Table 3 were admitted between Example 3 and Comparative Example 3.

TABLE 3

(Comparison in lattice constant of dielectric films between Example 3 and Comparative Example 3) (Lower electrode: $Ba_{0.1}Sr_{0.9}RuO_3$; $a_s$ = 5 0.3935 nm)

| | Example 3 | Comp. Example 3 |
|---|---|---|
| Lattice constant "a" (in-plane direction) | 0.394 nm | 0.399 nm |
| Lattice constant (thickness wise direction) | 0.432 nm | 0.423 nm |
| a/$a_s$ | 1.001 | 1.014 |

As seen from Table 3, the $BaTiO_3$ film which has been manufactured by setting the distance between the substrate and target to 140 mm, and applying the RF power of 600 W according to Example 3 indicated 0.432 nm in the lattice constant in the film-thickness direction (a direction perpendicular to the surface of film) and 0.394 nm in the lattice constant in the in-plane direction (a direction parallel with the surface of film). Namely, the ratio a/$a_s$ between the lattice constant in the in-plane direction of the $BaTiO_3$ film after the deposition thereof "a" and the lattice constant in the in-plane direction of the $Ba_{0.1}Sr_{0.9}RuO_3$ film constituting the substrate "$a_s$" was less than 1.002, falling within the range as defined by this invention.

On the other hand, the $BaTiO_3$ film which has been manufactured by setting the distance between the substrate and target to 170 mm, and applying the RF power of 400 W according to Comparative Example 3 indicated 0.423 nm in the lattice constant in the film-thickness direction (a direction perpendicular to the surface of film) and 0.399 nm in the lattice constant in the in-plane direction (a direction parallel with the surface of film). Namely, the ratio a/$a_s$ between the lattice constant in the in-plane direction of the $BaTiO_3$ film after the deposition thereof "a" and the lattice constant in the in-plane direction of the $Ba_{0.1}Sr_{0.9}RuO_3$ film constituting the substrate "$a_s$" was 1.01 or more, falling outside the range as defined by this invention.

Subsequently, a Pt film was deposited for use as an upper electrode 4 on these $BaTiO_3$ films by means of an RF sputtering method. Then, the Pt film was patterned by means of a lift-off method to form the upper electrode 4 having a size of 100 μm×100 μm.

Then, these two kinds of $BaTiO_3$ films formed under a different sputtering condition and differing in lattice constant from each other (Example 3 and Comparative Example 3) were subjected to a D-E hysteresis measurement with various frequencies. This measurement was performed using the Soyer-Tower circuit and setting the maximum amplitude of voltage to 10 V and the temperature to room temperature (22° C.

FIG. 24 shows a frequency dependence of twice of residual polarization 2 Pr (C/m$^2$) in the $BaTiO_3$ films of Example 3 and Comparative Example 3. As seen from FIG. 24, almost the same residual polarization was obtained in both $BaTiO_3$ films of Example 3 and Comparative Example 3. However, as the frequency was increased, the residual polarization of $BaTiO_3$ film of Comparative Example 3 was declined such that at the frequency of 100 kHz, the residual polarization of $BaTiO_3$ film of Comparative Example 3 was about a half of that of the $BaTiO_3$ film of Example 3.

By contrast, in the case of the $BaTiO_3$ film of Example 3, the decrease of the residual polarization over a frequency range of 5 Hz to 100 kHz was as small as about 5%. It will be seen from this fact that the epitaxial ferroelectric thin film as defined by this invention is capable of retaining an excellent ferroelectric properties even at a high frequency.

(EXAMPLE 4)

As shown in FIG. 1, a lower electrode 2 formed of an $SrRuO_3$ thin film having an orientation of (001) was deposited on a substrate 1 formed of $SiTiO_3$ (100) single crystal having a smooth surface by means of an RF magnetron sputtering method at a substrate temperature of 600° C. and in an atmosphere of $Ar:O_2=40:10$ (sccm) (entire pressure being about 0.6 Pa), thereby forming a conductive substrate of this Example. The film thickness of this $SrRuO_3$ film 2 was about 50 nm.

The $SrRuO_3$ film 2 thus formed was confirmed as being formed of a (001) orientation film having a perovskite type crystal structure by x-ray diffraction. It was further confirmed that, when the film was formed by means of RF sputtering method as mentioned above, the lattice constant in the direction perpendicular to the surface of the film was about 0.398 nm, while the lattice constant in the direction parallel with the surface of the film was about 0.3925 nm. Therefore, the $SrRuO_3$ film thus manufactured exhibits a crystal symmetry of tetragonal system, and is applicable as a lower electrode as defined by this invention.

The lattice constant parallel with the surface of the lower electrode ($a_s$) as defined by this invention can be represented by 0.3925 nm.

Then, a $Ba_{0.5}Sr_{0.5}TiO_3$ film having a thickness of about 130 nm was deposited as a ferroelectric film 3 on the $SrRuO_3$ film by means of an RF magnetron sputtering method. As for the sputtering target, a $Ba_{0.5}Sr_{0.5}TiO_3$ sintered body (4 inches in diameter and 5 mm in thickness) was used. The sputtering was performed by setting the substrate temperature to 600° C., employing a mixed gas atmosphere comprising argon (Ar) and oxygen ($O_2$) ($Ar:O_2=40:10$ (sccm)), and setting the distance between the substrate and the target to 140 mm. The RF power applied to the target was set to 600 W. The composition of the film thus formed was analyzed by means of an ICP method, finding these films as being very close to the stoichiometric composition.

In this case, the lattice constant of the $SrRuO_3$ film in the direction parallel with the surface thereof ($a_s$) was 0.3925 nm, whereas the inherent lattice constant of the a-axis of $Ba_{0.5}Sr_{0.5}TiO_3$ (tetragonal system) ($a_0$) is known to be about 0.395 nm, and hence $a_0/a_s$ is 1.006. Therefore, this value falls within the range as defined by this invention, i.e. $1.002 \leq a_0/a_s \leq 1.015$.

Then, as Comparative Example 4, a ferroelectric film was formed in the same manner as in Example 3. Namely, a lower electrode formed of a $SrRuO_3$ film 2 having an orientation of (001) was deposited on a $SiTiO_3$ (100) single crystal substrate 1 having a smooth surface by means of an RF magnetron sputtering method at a substrate temperature of 600° C. with other conditions being the same as in Example 3, thereby forming a conductive substrate of this Comparative Example. The film thickness of this $SrRuO_3$ film 2 was about 50 nm. The $SrRuO_3$ film 2 thus formed was confirmed by means of an X-ray diffraction as being formed of a (001) orientation film, exhibiting the same value as that of Example 4 in the lattice constant in the direction perpendicular to the surface of the film, i.e. about 0.3925 nm.

Then, a $Ba_{0.5}Sr_{0.5}TiO_3$ film having a thickness of about 130 nm was deposited as a ferroelectric film 3 on the $SrRuO_3$ film 2 by means of an RF magnetron sputtering method under different conditions from those of Example 4 as explained below. As for the sputtering target, a $Ba_{0.5}Sr_{0.5}TiO_3$ sintered body (4 inches in diameter and 5 mm in thickness) was used. The sputtering was performed by setting the substrate temperature to 600° C. employing a mixed gas atmosphere comprising argon (Ar) and oxygen ($O_2$) ($Ar:O_2=40:10$ (sccm)), and setting the distance between the substrate and the target to 170 mm. The RF power applied to the target was set to 400 W. Namely, this Comparative Example 4 differs in the sputtering condition from that of Example 4 in terms of the distance between the substrate and target, and the power applied, with other conditions being the same as those of Example 4, thereby forming the $Ba_{0.5}Sr_{0.5}TiO_3$ film.

These two kinds of (Ba, Sr)$TiO_3$ films prepared by changing the sputtering condition (Example 4 and Comparative Example 4) were evaluated in detail with regard to the crystal orientation and the lattice constant by means of an X-ray diffraction method and the RHEED method. As a result, it has been confirmed that in both cases, a (001) orientation film of $Ba_{0.5}Sr_{0.5}TiO_3$ was formed on the surface of the $SrRuO_3$ (001) film in the same manner, and the orientation of the film in relative to the underlying $SrRuO_3$ film (the lower electrode) was indicated correlations of: BST (100) vs SR (100); and BST (001) vs SR (001).

However, as far as the lattice constant of the $Ba_{0.5}Sr_{0.5}TiO_3$ film is concerned, the differences as shown in the following Table 4 were admitted between Example 4 and Comparative Example 4.

TABLE 4

(Comparison in lattice constant of dielectric films between Example 4 and Comparative Example 4) (Lower electrode; $SrRuO_3$: as = 0.3925 nm)

|  | Example 4 | Comp. Example 4 |
| --- | --- | --- |
| Lattice constant "a" (in-plane direction) | 0.393 nm | 0.394 nm |
| Lattice constant (thickness wise direction) | 0.413 nm | 0.411 nm |
| $a/a_s$ | 1.0012 | 1.0038 |

As seen from Table 4, the $Ba_{0.5}Sr_{0.5}TiO_3$ film which has been manufactured by setting the distance between the substrate and target to 140 mm, and applying the RF power of 600 W according to Example 4 indicated 0.413 nm in the lattice constant in the film-thickness direction and 0.393 nm in the lattice constant in the in-plane direction. Namely, the ratio $a/a_s$ between the lattice constant in the in-plane direction of the $Ba_{0.5}Sr_{0.5}TiO_3$ film after the deposition thereof "a" and the lattice constant in the in-plane direction of the $SrRuO_3$ film constituting the substrate "$a_s$" was less than 1.002, falling within the range as defined by this invention.

On the other hand, the $Ba_{0.5}Sr_{0.5}TiO_3$ film which has been manufactured by setting the distance between the substrate and target to 170 mm, and applying the power of 400 W according to Comparative Example 4 indicated 0.411 nm in the lattice constant in the film-thickness direction and 0.394 nm in the lattice constant in the in-plane direction. Namely, the ratio $a/a_s$ between the lattice constant in the in-plane direction of the $Ba_{0.5}Sr_{0.5}TiO_3$ film after the deposition thereof "a" and the lattice constant in the in-plane direction of the SrRuO$_3$ film constituting the substrate "$a_s$" was 1.003 or more, falling outside the range as defined by this invention.

Subsequently, a Pt film was deposited for use as an upper electrode 4 on these (BaSr)TiO$_3$ films by means of an RF sputtering method. Then, the Pt film was patterned by means of a lift-off method to form the upper electrode 4 having a size of 100 μm×100 μm.

Then, these two kinds of Ba$_{0.5}$Sr$_{0.5}$TiO$_3$ films (Example 4 and Comparative Example 4) were compared with respect to the polarization-retention property thereof. The measurement of this polarization-retention property was performed by applying either a rectangular pulse of +5 V (pulse width: 200 ns) or a rectangular pulse of –5 V (pulse width; 200 ns) to the upper electrode 4, and then by measuring and comparing the quantity of charge which has been passed into the electrode when a readout pulse of +5 V (pulse width: 200 ns) was applied again after one second and after 10 minutes to the electrode. Namely, the quantity of charge which has been passed into the electrode at the moment of the readout where the electrode was initially impressed with a pulse of +5 V was defined as Qns, whereas the quantity of charge which has been passed into the electrode at the moment of the readout where the electrode was initially impressed with a pulse of –5 V was defined as Qsw. Then, a difference in charge dQ between Qns and Qsw was compared (dQ=Qsw−Qns).

As a result, in the case of Example 4, the difference in charge dQ was admitted as being 0.12 C/m$^2$ (dQ=0.12 C/m$^2$) in both measurements conducted after one second and after 10 minutes. By contrast, in the case of Comparative Example 4, the difference in charge dQ in the measurement after one second was 0.10 C/m$^2$, but this difference in charge dQ was decreased down to 0.01 C/m$^2$ in the measurement after 10 minutes. Namely, in the case of Example 4, a sufficient retention property was assured owing to the ferroelectricity, but in the case of Comparative Example 4, it failed to obtain such a sufficient retention property, indicating that the device of Comparative Example 4 was not applicable to a non-volatile memory.

(EXAMPLE 5)

As shown in FIG. 1, a lower electrode 2 formed of an SrRuO$_3$ thin film having an orientation of (001) was deposited on a substrate 1 formed of SiTiO$_3$ (100) single crystal having a smooth surface by means of an RF magnetron sputtering method at a substrate temperature of 600° C. and in an atmosphere of Ar:O$_2$=40:10 (sccm) (entire pressure being about 0.6 Pa), thereby forming a conductive substrate of this Example. The film thickness of this SrRuO$_3$ film 2 was about 50 nm.

The SrRuO$_3$ film 2 thus formed was confirmed as being formed of a (001) orientation film having a perovskite type crystal structure by X-ray diffraction. It was further confirmed that, when the film was formed by means of sputtering method as mentioned above, the lattice constant in the direction perpendicular to the surface of the film was in the range of about 0.3979 nm to 0.3991 nm, while the lattice constant in the direction parallel with the surface of the film was in the range of about 0.3906 nm to 0.3913 nm (Table 6). Therefore, the SrRuO$_3$ film thus manufactured exhibits a crystal symmetry of tetragonal system, and is applicable as a lower electrode as defined by this invention.

The lattice constant parallel with the surface of the lower electrode ($a_s$) as defined by this invention can be represented by 0.391 nm.

Then, a (Ba$_x$Sr$_{1-x-y}$Ca$_y$)TiO$_3$ film having a thickness of about 50 nm was deposited as a ferroelectric film 3 on the SrRuO$_3$ film by means of a 3-source RF magnetron sputtering method using three separate targets. As for the sputtering target, a BaTiO$_3$ sintered body, a SrTiO$_3$ sintered body and a CaTiO$_3$ sintered body (each 4 inches in diameter and 5 mm in thickness) were used. The sputtering was performed by setting the substrate temperature to 600° C., employing a mixed gas atmosphere comprising argon (Ar) and oxygen (O$_2$) (Ar:O$_2$=40:10 (sccm)), and setting the distance between the substrate and the targets to 140 mm. The RF power applied to the targets was set to 600 W constant against the BaTiO$_3$ sintered body, 450 W constant against the SrTiO$_3$ sintered body, and a variable power of from 0 to 500 W against the CaTiO$_3$ sintered body. The composition of the film thus formed was analyzed by means of an ICP emission spectroscopy, the results being shown in the following Table 5.

Figure 25:
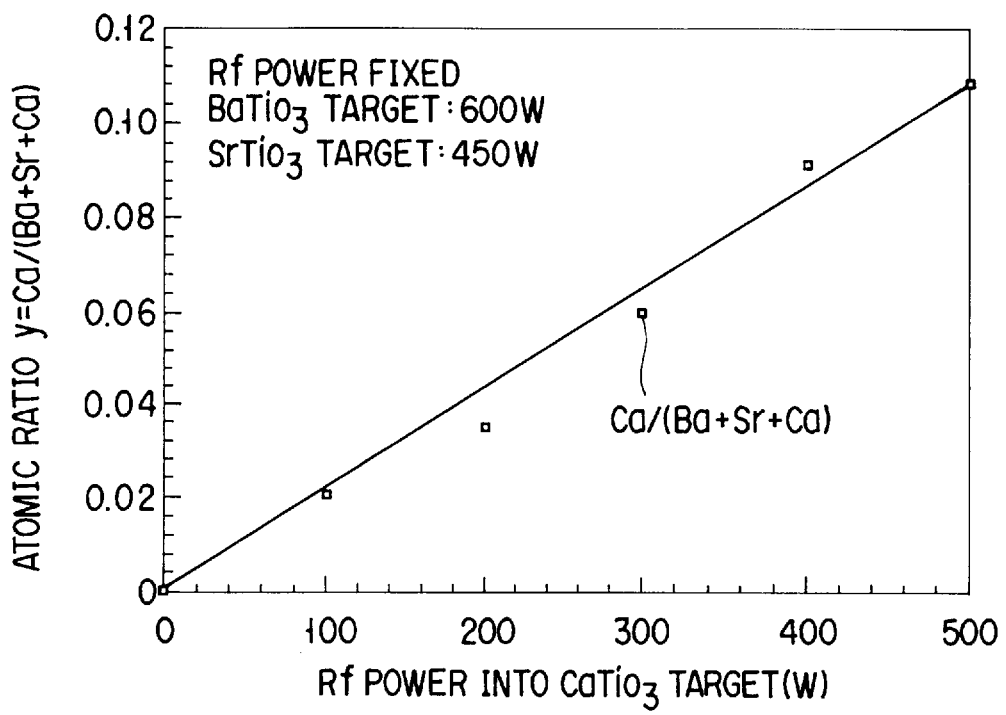
FIG. 25 is a graph showing a relationship between the RF power applied for a $CaTiO_3$ sintered target and the quantity of Ca in a dielectric film.

When a relationship between the RF power applied for the CaTiO$_3$ sintered target and the quantity of Ca in the dielectric film was measured, the results shown in FIG. 25 was obtained. As seen from FIG. 25, the quantity of Ca in the dielectric film was substantially proportional to the RF power spent for the CaTiO$_3$ sintered target. The thickness of the (Ba$_x$Sr$_{1-x-y}$Ca$_y$)TiO$_3$ film was found, as measured by making use of a step-meter, to distribute in the range of 46 to 52 nm as shown in the following Table 5.

TABLE 5

| Thickness of (Ba, Sr, Ca) TiO$_3$ film and results of composition analysis | | | | | |
|---|---|---|---|---|---|
| CaTiO$_3$ Power | thickness (nm) | Ba | Sr | Ti | Ca |
| 0 | 50 | 0.615 | 0.507 | 0.990 | 0.000 |
| 100 | 50 | 0.616 | 0.385 | 0.978 | 0.021 |
| 200 | 53 | 0.580 | 0.447 | 0.936 | 0.038 |
| 300 | 46 | 0.554 | 0.467 | 0.913 | 0.065 |
| 400 | 47 | 0.534 | 0.450 | 0.917 | 0.100 |
| 500 | 47 | 0.533 | 0.428 | 0.921 | 0.118 |

When the crystal structure of five kinds of (Ba$_x$Sr$_{1-x-y}$Ca$_y$)TiO$_3$ films each differing in the content of Ca were analyzed by making use of an X-ray diffraction, all of these films indicated an orientation of (001), and hence the heteroepitaxial growth of these films on the surface of the SrRuO$_3$ film with a correlation of so-called cube-on-cube was confirmed. When the lattice constant of these films was measured, the lattice constant in thicknesswise direction "c" was all in the range of from 0.422 nm to 0.428 nm, though some degree of difference was admitted depending on the quantity of Ca as shown in the following Table 6, indicating an extension of 5% or more as compared with the original lattice constant, i.e. the inherent lattice constant. However, with respect to the lattice constant in the in-plane direction "a", the lattice constant was found to be completely equivalent to the a-axis of the SrRuO$_3$ film, suggesting that it was not relaxed.

TABLE 6

Lattice constant of SrRuO₃ film and (Ba$_x$Sr$_{1-x-y}$Ca$_y$) TiO₃ film

| CaTiO₃ rf Power (W) | Ca/(Ba + Sr + Ca) | SrRuO₃ a-axis (nm) | SrRuO₃ c-axis (nm) | (Ba, Sr, Ca) TiO₃ a-axis (nm) | (Ba, Sr, Ca) TiO₃ c-axis (nm) |
|---|---|---|---|---|---|
| 0 | 0 | 0.3907 | 0.3987 | 0.3902 | 0.4281 |
| 100 | 0.021 | 0.3913 | 0.3987 | 0.3905 | 0.4281 |
| 200 | 0.035 | 0.3906 | 0.3991 | 0.3901 | 0.4263 |
| 300 | 0.065 | 0.3907 | 0.3979 | 0.3905 | 0.4263 |
| 400 | 0.092 | 0.3906 | 0.3989 | 0.3906 | 0.4236 |
| 500 | 0.109 | 0.3906 | 0.3989 | 0.3904 | 0.422 |

Subsequently, a Pt film was deposited for use as an upper electrode 4 on these five kinds of (Ba$_x$S$_{1-x-y}$Ca$_y$) TiO₃ films containing different quantity of Ca by means of a sputtering method. Then, the Pt film was patterned by means of a lift-off method to form the upper electrode 4 having a size of 100 μm×100 μm.

Figure 26:
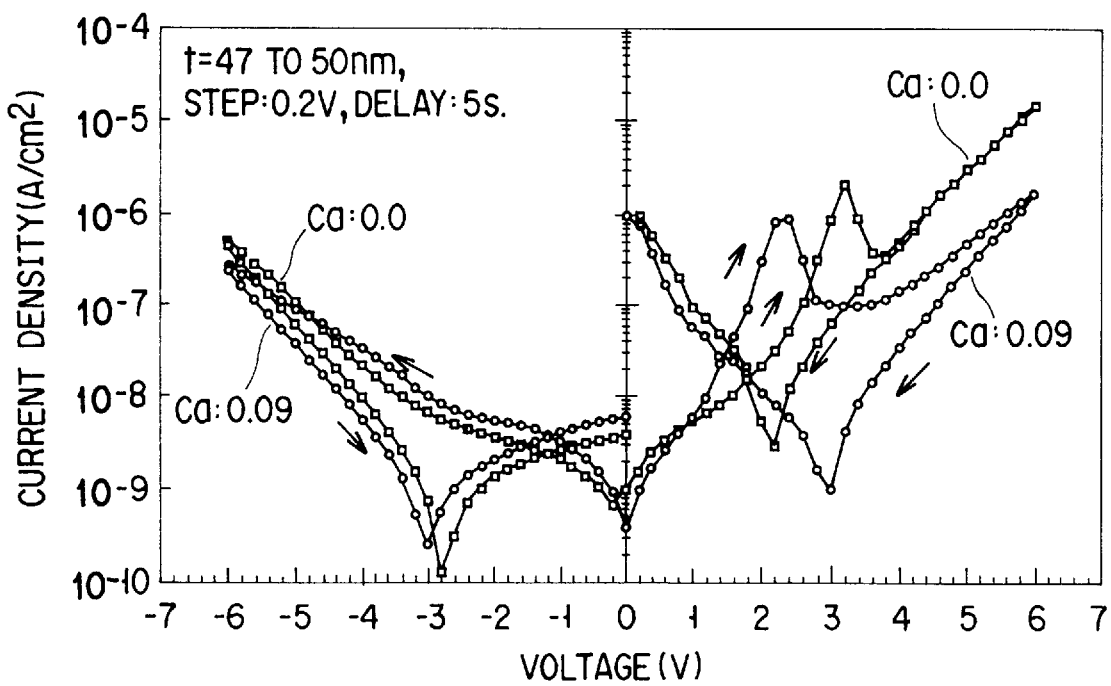
FIG. 26 is a graph illustrating the changes of leakage current with the ratio of Ca.
Figure 27:
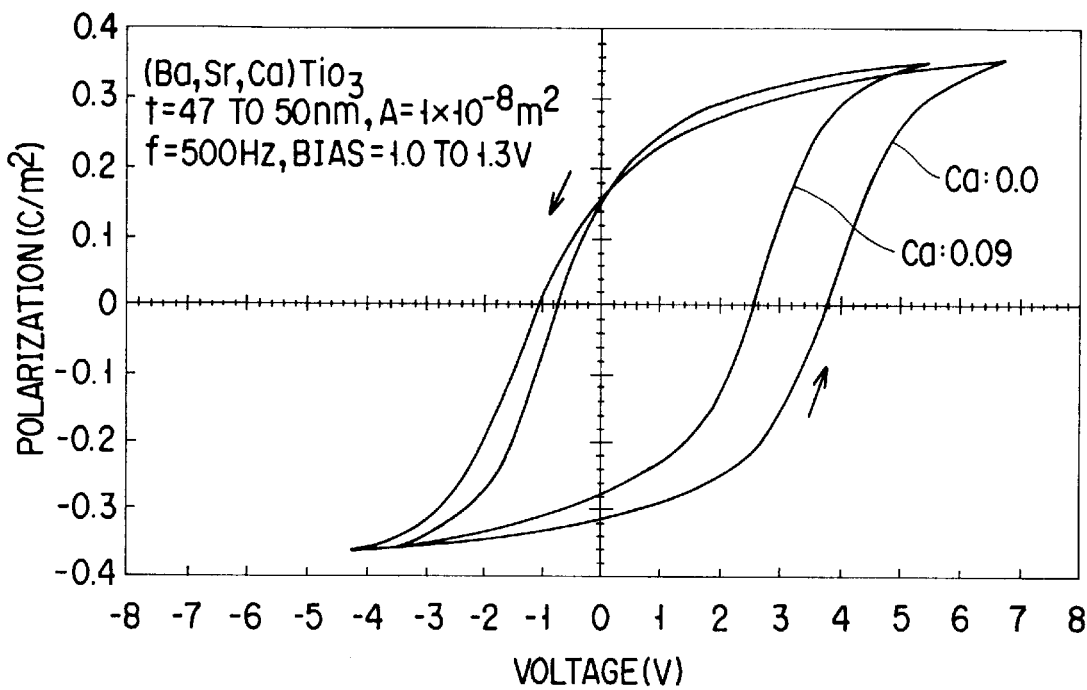
FIG. 27 is a graph illustrating the changes in hysteresis curve with the ratio of Ca.

When the current-voltage characteristics of these (Ba$_x$Sr$_{1-x-y}$Ca$_y$)TiO₃ films thus obtained were measured, results shown in FIG. 26 was obtained. As shown in FIG. 26, the films containing Ca all indicated a decrease of leakage current in the high voltage region as compared with the film containing no Ca (y=0).

The degree in lowering of leakage current is not dependent on the quantity "y" of Ca, so that when the quantity "y" was larger than 2%, almost the same degree of effect was admitted as compared with the film containing no Ca irrespective of the quantity of "y".

On the other hand, when the relationship between the polarization "P" and the voltage "V" of these films was measured by making use of a Soyer-tower circuit at 500 Hz, all of five kinds of (Ba$_x$Sr$_{1-x-y}$Ca$_y$)TiO₃ films each differing in Ca content showed a hysteresis indicating a ferroelectricity. It should be noted that these dielectric films should be indicating a paraelectricity at room temperature if they are in the form of bulk in view of their compositions. Therefore, it is assumed that the ferroelectricity thereof was introduced through a mismatching of lattice constant. However, according to the shape of the hysteresis, a difference of the ferroelectricity by the Ca content was observed.

Figure 28:
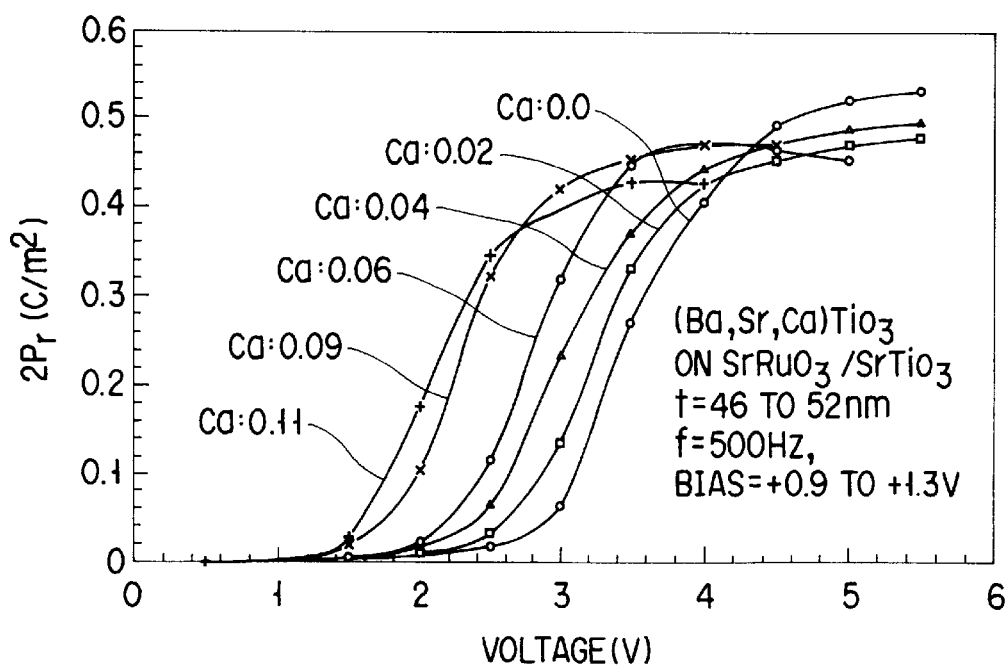
FIG. 28 is a graph illustrating a relationship between the ratio of Ca and the rise in hysteresis curve.

FIG. 28 shows a relationship between the amplitude of ac voltage to be employed for measuring the hysteresis curve and the residual polarization to be obtained with this voltage amplitude. As seen from FIG. 28, when the Ca content "y" is increased, the voltage for initiating the ferroelectric hysteresis is proportionally decreased. Moreover, the absolute value of the residual polarization as the polarization is saturated is comparable to the composition where Ca is not substituted.

This invention is not restricted to the aforementioned examples. For example, the dielectric film is not limited to BaTiO₃ or (Ba,Sr)TiO₃, but various kinds of perovskite crystal type dielectric material which have been epitaxially grown can be employed. For instance, a simple perovskite type oxide such as strontium titanate (SrTiO₃), calcium titanate (CaTiO₃), barium stannate (BaSnO₃) and barium zirconate (BaZrO₃); a composite perovskite type oxide such as barium magnesate tantalate (Ba(Mg$_{1/3}$Ta$_{2/3}$)O₃) and barium magnesium niobate (Ba(Mg$_{1/3}$Nb$_{2/3}$)O₃); and a solid solution comprising a plurality of these oxides may be employed.

Further, the component "A" in the general formula ABO₃, representing a dielectric substance having a perovskite crystal structure, is mainly constituted by Ba in this invention. However, part of Ba may be substituted by at least one element selected from Sr and Ca. Further, although B is mainly constituted by Ti, part of Ti may be substituted by at least one element or composite selected from the group consisting of Zr, Hf, Sn, Mg$_{1/3}$Nb$_{2/3}$, Mg$_{1/3}$Ta$_{2/3}$, Zn$_{1/3}$Nb$_{2/3}$, Zn$_{1/3}$Ta$_{2/3}$. Additionally, as for the method of forming a dielectric film, a reactive vapor deposition, a MOCVD method, a laser ablation and a sol-gel method may be employed in addition to the RF sputtering method.

In the above examples, a conductive substrate of a tetragonal system was employed. However, it is also possible to employ a conductive substrate of a cubic system.

It is possible according to this invention to enhance the dielectric constant of the film by taking advantage of the expansion of unit lattice volume due to a film-forming condition or by taking advantage of mismatching in lattice constant with a lower electrode, and also to suppress the conventional problems involved in inducing a ferroelectricity, e.g. to suppress the frequency dependence of dielectric constant, a high dielectric loss, or the frequency dependence of residual polarization.

Therefore, it is possible to manufacture a reliable high dielectric film or ferroelectric thin film, which is free from a low-melting point metal such as lead or bismuth, large in dielectric constant or in residual polarization. Accordingly, it is possible to realize a thin film capacitor which is suited for enhancing the capacity or integration of a semiconductor memory, thereby greatly contributing to the development of a DRAM or a non-volatile memory.

Additional advantages and modifications will readily occur to those skilled in the art. Therefore, the invention in its broader aspects is not limited to the specific details, and representative embodiments shown and described herein. Accordingly, various modifications may be made without departing from the spirit or scope of the general inventive concept as defined by the appended claims and their equivalents.

We claim:

1. A thin film capacitor comprising:
   a first electrode having on a surface one of a (100) face of a cubic system or a (001) face of a tetragonal system;
   a dielectric thin film epitaxially grown on said first electrode and exhibiting a crystal structure which inherently belongs to a perovskite structure of a cubic system; and
   a second electrode formed on said dielectric thin film;
   wherein said dielectric thin film meets the following relationship:

$V/V_0 \geq 1.01$ where a unit lattice volume of an inherent perovskite crystal structure belonging to a cubic system (lattice constant: $a_0$) is represented by $V_0 = a_0^3$, and a unit lattice volume (lattice constant a=b≠c) which is strained toward a tetragonal system after the epitaxial growth is represented by $V = a^2 c$; and also meets the following relationship:

$c/a \geq 1.01$ where c/a represents a ratio between a lattice constant "c" in a thickness direction of said dielectric thin film and a lattice constant "a" in a direction parallel with a plane of said dielectric thin film.

2. The thin film capacitor according to claim 1, wherein said dielectric thin film meets the following relationship:

$$1.05 \geq V/V_0 \geq 1.01$$

3. The thin film capacitor according to claim 1, wherein said dielectric thin film meets the following relationship:
$1.03 \geq c/a \geq 1.01$; when said dielectric thin film is formed of a paraelectric material; and
$1.08 \geq c/a \geq 1.01$; when said dielectric thin film is formed of a ferroelectric material.

4. The thin film capacitor according to claim 1, wherein said dielectric thin film is formed of a compound represented by the following formula:

$$ABO_3$$

wherein A represents at least one element selected from the group consisting of Ba, Sr and Ca; and B represents at least one member selected from the group consisting of Ti, Zr, Hf, Sn, $Mg_{1/3}Nb_{2/3}$, $Mg_{1/3}Ta_{2/3}$, $Zn_{1/3}Nb_{2/3}$, $Zn_{1/3}Ta_{2/3}$, $Ni_{1/3}Nb_{2/3}$, $Ni_{1/3}Ta_{2/3}$, $Co_{1/3}Nb_{2/3}$, $Co_{1/3}Ta_{2/3}$, $Sc_{1/3}Nb_{2/3}$ and $Sc_{1/3}Ta_{2/3}$.

5. The thin film capacitor according to claim 4, wherein said dielectric thin film is formed of a compound represented by $(Ba_xSr_{1-x})TiO_3$ (0<x<0.7).

6. The thin film capacitor according to claim 4, wherein said dielectric thin film is formed of a compound of perovskite crystal structure, which is represented by $(Ba_xSr_{1-x-y}Ca_y)TiO_3$ (0<x<0.7; 0.01<y<0.12).

7. The thin film capacitor according to claim 1, wherein said first electrode is formed of a conductive compound of perovskite crystal structure, which is represented by the following formula:

$$ABO_3$$

wherein A represents at least one element selected from the group consisting of Ba, Sr, Ca and La; and B represents at least one element selected from the group consisting of Ru, Ir, Mo, W, Co, Ni and Cr.

8. The thin film capacitor according to claim 7, wherein said first electrode is formed of a conductive compound of perovskite crystal structure, which is represented by $SrRuO_3$ (0.9<Sr/Ru<1.1).

9. The thin film capacitor according to claim 1, wherein said dielectric thin film is formed of a compound represented by $(Ba_xSr_{1-x})TiO_3$ (0<x<0.7), and said first electrode is formed of a conductive compound of perovskite crystal structure, which is represented by $SrRuO_3$ (0.9<Sr/Ru<1.1).

10. The thin film capacitor according to claim 1, wherein said second electrode is formed of a conductive compound of perovskite crystal structure, which is represented by the following formula:

$$ABO_3$$

wherein A represents at least one element selected from the group consisting of Ba, Sr, Ca and La; and B represents at least one element selected from the group consisting of Ru, Ir, Mo, W, Co, Ni and Cr.

11. The thin film capacitor according to claim 10, wherein said second electrode is formed of a conductive compound of perovskite crystal structure, which is represented by $SrRuO_3$ (0.9<Sr/Ru<1.1).

12. The thin film capacitor according to claim 1, wherein said capacitor is a capacitor for a DRAM.

13. A thin film capacitor comprising:
a first electrode having on a surface one of a (100) face of a cubic system or a (001) face of a tetragonal system;
a dielectric thin film epitaxially grown on said first electrode and exhibiting a crystal structure which inherently belongs to a perovskite structure of a cubic system; and
a second electrode formed on said dielectric thin film;
wherein said dielectric thin film meets the following relationship:

$$a_0/a_s \leq 1.002$$

where $a_s$ represents a lattice constant in a direction parallel with a surface of said first electrode, and $a_0$ represents a lattice constant inherent to a dielectric material constituting said dielectric thin film, which can be expressed by a length of an a-axis of a perovskite crystal structure belonging to a cubic system; and also meets the following relationship:

$$c/a \geq 1.01$$

where c/a represents a ratio between a lattice constant "c" in a thickness direction of said film and a lattice constant "a" in a direction parallel with a plane of said film.

14. The thin film capacitor according to claim 13, wherein said dielectric thin film meets the following relationship:

$$1.1 \geq c/a \geq 1.01$$

15. The thin film capacitor according to claim 13, wherein said dielectric thin film is formed of a compound represented by the following formula:

$$ABO_3$$

wherein A represents at least one element selected from the group consisting of Ba, Sr and Ca; and B represents at least one member selected from the group consisting of Ti, Zr, Hf, Sn, $Mg_{1/3}Nb_{2/3}$, $Mg_{1/3}Ta_{2/3}$, $Zn_{1/3}Nb_{2/3}$, $Zn_{1/3}Ta_{2/3}$, $Ni_{1/3}Nb_{2/3}$, $Ni_{1/3}Ta_{2/3}$, $Co_{1/3}Nb_{2/3}$, $Co_{1/3}Ta_{2/3}$, $Sc_{1/3}Nb_{2/3}$ and $Sc_{1/3}Ta_{2/3}$.

16. The thin film capacitor according to claim 15, wherein said dielectric thin film is formed of a compound represented by $(Ba_xSr_{1-x})TiO_3$ ($0 \leq x<0.7$).

17. The thin film capacitor according to claim 15, wherein said dielectric thin film is formed of a compound of perovskite crystal structure, which is represented by $(Ba_xSr_{1-x-y}Ca_y)TiO_3$ (0<x<0.7; 0.01<y<0.12).

18. The thin film capacitor according to claim 13, wherein said first electrode is formed of a conductive compound of perovskite crystal structure, which is represented by the following formula:

$$ABO_3$$

wherein A represents at least one element selected from the group consisting of Ba, Sr, Ca and La; and B represents at least one element selected from the group consisting of Ru, Ir, Mo, W, Co, Ni and Cr.

19. The thin film capacitor according to claim 18, wherein said first electrode is formed of a conductive compound of perovskite crystal structure, which is represented by $SrRuO_3$ (0.9<Sr/Ru<1.1).

20. The thin film capacitor according to claim 13, wherein said dielectric thin film is formed of a compound represented by $(Ba_xSr_{1-x})TiO_3$ (0<x<0.7), and said first electrode is formed of a conductive compound of perovskite crystal structure, which is represented by $SrRuO_3$ (0.9<Sr/Ru<1.1).

21. The thin film capacitor according to claim 13, wherein said second electrode is formed of a conductive compound of perovskite crystal structure, which is represented by the following formula:

$$ABO_3$$

wherein A represents at least one element selected from the group consisting of Ba, Sr, Ca and La; and B represents at least one element selected from the group consisting of Ru, Ir, Mo, W, Co, Ni and Cr.

22. The thin film capacitor according to claim 21, wherein said second electrode is formed of a conductive compound of perovskite crystal structure, which is represented by $SrRuO_3$ (0.9<Sr/Ru<1.1).

23. The thin film capacitor according to claim 13, wherein said capacitor is a capacitor for a DRAM.

* * * * *